US 6,690,557 B2

(12) United States Patent
Hung et al.

(10) Patent No.: US 6,690,557 B2
(45) Date of Patent: Feb. 10, 2004

(54) CMOS WHOLE CHIP LOW CAPACITANCE ESD PROTECTION CIRCUIT

(75) Inventors: Kei-Kang Hung, Changhua Hsien (TW); Chien-Hui Chuang, Taipei Hsien (TW)

(73) Assignee: Faraday Technology Corp., Hsinchu (TW)

( * ) Notice: Subject to any disclaimer, the term of this patent is extended or adjusted under 35 U.S.C. 154(b) by 180 days.

(21) Appl. No.: 10/004,670

(22) Filed: Dec. 4, 2001

(65) Prior Publication Data
US 2003/0058592 A1 Mar. 27, 2003

(30) Foreign Application Priority Data
Sep. 24, 2001 (TW) ............................................ 90123428

(51) Int. Cl.$^7$ ................................................. H02H 3/22
(52) U.S. Cl. .................... 361/56; 361/111; 257/173; 257/355
(58) Field of Search ...................... 361/56, 91, 111; 257/173, 355

(56) References Cited

U.S. PATENT DOCUMENTS 5,670,799 A * 9/1997 Croft ........................... 257/173
5,959,820 A * 9/1999 Ker et al. .................... 361/111
6,573,566 B2 * 6/2003 Ker et al. .................... 257/355

* cited by examiner

Primary Examiner—Gregory J. Toatley, Jr.
Assistant Examiner—Boris Benenson
(74) Attorney, Agent, or Firm—J.C. Patents

(57) ABSTRACT

A low capacitance electrostatic discharge circuit (ESD) for a built-in CMOS chip capable of protecting an internal circuit within the chip. A first voltage source and a second voltage source are provided to the electrostatic protection circuit. The ESD circuit is coupled to a bonding pad and the internal circuit. The ESD protection circuit includes a first diode series, a second diode series, a first control circuit, a third diode series, a first silicon-controlled rectifier (SCR), a second control circuit, a fourth diode series and a second SCR. The ESD circuit utilizes the control circuits to initiate substrate triggering so that the triggered voltage of the SCR is lowered and holding voltage of the SCR during conduction in increased. Consequently, the entire chip is protected and input capacitance of the circuit is reduced.

36 Claims, 7 Drawing Sheets

CMOS WHOLE CHIP LOW CAPACITANCE ESD PROTECTION CIRCUIT

CROSS-REFERENCE TO RELATED APPLICATION

This application claims the priority benefit of Taiwan application serial no. 90123428, filed Sep. 24, 2001.

BACKGROUND OF THE INVENTION

1. Field of Invention

This present invention relates to an electrostatic discharge protection circuit More particularly, the present invention relates to a low capacitance electrostatic discharge protection circuit for a built CMOS chip.

2. Description of Related Art

Electrostatic discharge (ESD) during or after fabrication is one of the major causes of damage for an integrated circuit (IC) such as dynamic random access memory (DRAM) and static random access memory (SRAM). A person walking on a carpet produces a static voltage ranging from a few hundred to a few thousand volts when the relative humidity (RH) of the surrounding air is high. If the relative humidity is really low, an electrostatic voltage exceeding ten thousand volts may be produced. IC packaging machines or IC testers may also generate a static voltage ranging from a few hundred to a few thousand volts depending on surrounding temperature and humidity When these conductive bodies contact a silicon chip, electrostatic charges may be released through the chip leading to a failure of internal integrated circuits. To prevent any damages to the integrated circuits due to an ESD, various methods are developed. FIG. 1 is a diagram showing a conventional ESD protection circuit. As shown in FIG. 1 (also refer to U.S. Pat. No. 4,896,243), a lateral silicon controlled rectifier (LSCR) 102 is used to protect an input buffer 104 against damages due to ESD. As an ESD event enters through a bonding pad 106, the voltage created by an ESD source is higher than the triggered voltage of the LSCR 102. The LSCR 102 conducts permitting the flow of a bypass current. Hence, ESD current is prevented from passing into the buffer 104 to cause any damages.

FIG. 2 is a graph showing the current-voltage relationship of the LSCR in FIG. 1. As shown in FIG. 2, an operating voltage VDD applied to the anode node of the LSCR 102 will not lead to the turn-on of the LSCR 102. Hence, no leakage current flows in the LSCR 102. On the other hand, as an ESD voltage having a voltage higher than the triggered point (the triggered voltage such as 50V in FIG. 2) is applied to the anode, the LSCR 102 conducts and permits the majority of the ESD current to bypass. As the LSCR 102 is triggered on, the LSCR 102 steps into a holding region where a voltage drop of just 1V exists between the anode node and the cathode node of the LSCR 102.

Aside from using LSCR as device for conducting an electrostatic discharge bypass, other devices includes modified lateral silicon controlled rectifier (MLSCR) and low-voltage trigger lateral silicon controlled rectifier (LVTSCR) may be used.

FIG. 3 is a graph showing the current-voltage relationship of a MLSCR. As shown in FIG. 3 (refer to U.S. Pat. No. 4,939,616), an operating voltage VDD applied to the anode node of the MLSCR will not lead to the turn-on of the MLSCR. Hence, no leakage current flows in the MLSCR. On the other hand, as an ESD voltage having a voltage higher than the triggered point (the turn-on voltage such as 25V in FIG. 3) is applied to the anode node, the MLSCR conducts and permits majority of the ESD current to bypass. As the MLSCR is triggered on, the MLSCR steps into a holding region where a voltage drop of just 1V exists between the anode node and the cathode node of the MLSCR. Since the MLSCR has a lower triggered voltage than the LSCR, MLSCR permits ESD at a lower voltage. Hence, MLSCR provides more effective protection for input buffers gate oxide (may also protect output buffers and other internal circuits as well).

FIG. 4 is a graph showing the current-voltage relationship of a LVTSCR. As shown in FIG. 4 (refer to U.S. Pat. No. 5,465,189), an operating voltage VDD applied to the anode node of the LVTSCR will not lead to the turn-on of the LVTSCR. Hence, no leakage current flows in the LVTSCR. On the other hand, as an ESD voltage having a voltage higher than the triggered point (the turn-on voltage such as 10V in FIG. 4) is applied to the anode node, the LVTSCR conducts and permits majority of the ESD current to bypass. As the LVTSCR is triggered on, the LVTSCR steps into a holding region where a voltage drop of just 1V exists between the cathode and anode of the LVTSCR. Since the LVTSCR has a triggered voltage lower than the LSCR and the MLSCR, the LVTSCR permits ESD at a lower voltage still. Hence, the LVTSCR provides even more effective protection for input buffers gate oxide (it may also protect output buffers and other internal circuits as well).

The SCR (such as LSCR, MLSCR or LVTSCR) used inside an ESD protection circuits occupies relatively small chip area and provides very high voltage protection. However, the SCR may be triggered into a turned-on state due to noise leading to the passage of current into the ESD protection circuit unnecessarily. Furthermore, since the holding voltage once the SCR is turned on is much lower than its normal operating voltage, the SCR may produce a large leakage current.

In addition, due to dimensional requirements of semiconductor fabrication, breakdown voltage of the gate oxide layer of the MOS transistor for an input buffer and the junction between voltage of an output buffer is gradually lowered. Because the LSCR or the MLSCR has a relatively high triggered voltage, the LSCR or the MLSR may not be turned on fast enough to protect the input and output buffers against any damages when an ESD occurs. Although the LVTSCR has a lower triggered voltage, internal circuits may still be damaged by ESD if no control circuit is used to reduce triggered voltage further because long metal routing layout will cause much RC delay. Since most internal circuit devices are fabricated according to the smallest design rules and the carrier chip increasingly miniaturized, damages to internal circuits due to non-effective ESD protection is likely to cause more problems.

SUMMARY OF THE INVENTION

Accordingly, one object of the present invention is to provide a low capacitance electrostatic discharge (ESD) protection circuit for a CMOS whole chip. The protection circuit utilizes a control circuit to produce a substrate-triggered design so that silicon controlled rectifier (SCR) triggered voltage is effectively reduced and turn-on efficiency of the ESD protection circuit is increased. Furthermore, holding voltage of the SCR is also raised so that a large leakage current due to latching when SCR is accidentally triggered on is prevented. Hence, the ESD protection circuit provides full protection of the silicon chip. In addition, the protection circuit employs a low input capacitance design so that the chip protection circuit can be used inside high frequency or radio frequency circuits as well.

To achieve these and other advantages and in accordance with the purpose of the invention, as embodied and broadly described herein, the invention provides a low capacitance electrostatic discharge (ESD) protection circuit for a CMOS whole chip. The ESD protection circuit protects internal circuits of the silicon chip. A first voltage source and a second voltage source are applied to the ESD protection circuit. The ESD protection circuit is coupled to a bonding pad and an internal circuit. The ESD protection circuit includes a first diode series, a second diode series, a first control circuit, a third diode series, a first silicon controlled rectifier (SCR), a second control circuit, a fourth diode series and a second silicon controlled rectifier (SCR). The negative terminal of the first diode series is coupled to the first voltage source. The positive terminal of the first diode series is coupled to the bonding pad. The negative terminal of the second diode series is coupled to the positive terminal of the first diode series and the positive terminal of the second diode series is coupled to the second voltage source. A first terminal of the first control circuit is coupled to the positive terminal of one of the diodes in the first diode series. When an electrostatic discharge occurs, the first control circuit outputs a first triggering current. The positive terminal of the third diode series is coupled to the first voltage source and the negative terminal of the third second diode series is coupled to the second voltage source. The cathode of the first SCR is coupled to the negative terminal of the $(A-1)^{th}$ diodes of the third diode series. The triggering electrode of the first SCR receives the first triggering current transmitted from the first control circuit. The anode of the first SCR is coupled to the positive terminal of the $A^{th}$ diode in the third diode series. A first terminal of the second control circuit is coupled to the positive terminal of one of the diodes in the second diode series. When an electrostatic discharge occurs, the second control circuit outputs a second triggering current. The positive terminal of the fourth diode series is coupled to the first voltage source and the negative terminal of the fourth diode series is coupled to the second voltage source. The cathode of the second SCR is coupled to the positive terminal of the (B−1)th diode of the fourth diode series. The triggering terminal of the second SCR receives the second triggering current submitted from the second control circuit. The anode of the second SCR is coupled to the negative terminal of the Bth diode of the fourth diode series. The ESD protection circuit uses the control circuit for substrate triggering, thereby lowering triggered voltage of the SCR and increasing holding voltage of the SCR during turning-on. Ultimately, the entire chip is ESD protected and input capacitance is greatly reduced.

The above stated descriptions and statements are meant to be of a explanatory nature only and are not bound or restricted by the limited definition of the invention as claimed.

BRIEF DESCRIPTION OF THE DRAWINGS

The accompanying drawings are included to help provide a further understanding of the invention and are incorporated in, and constitute a part of, this specification. The drawings illustrate embodiments of the invention and, together with the description, serve to explain the principles of the invention. In the drawings.

DESCRIPTION OF THE PREFERRED EMBODIMENTS

Figure 1:
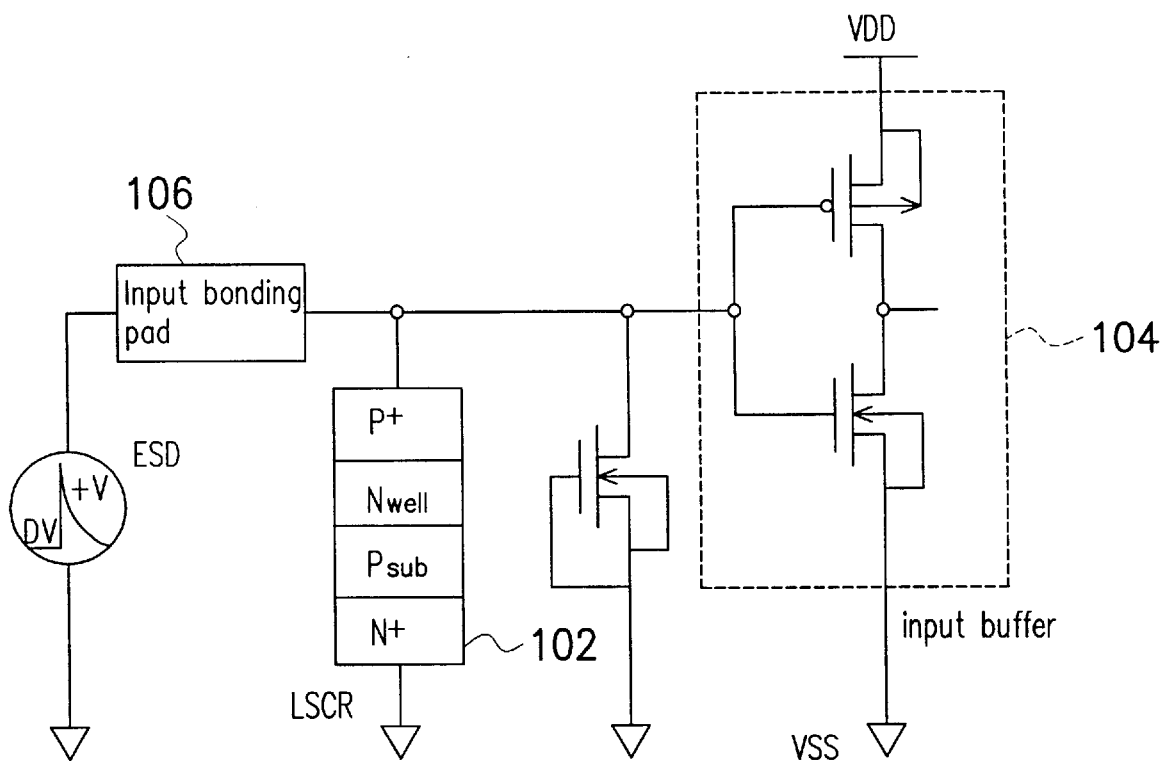
FIG. 1 is a diagram showing a conventional ESD protection circuit.
Figure 2:
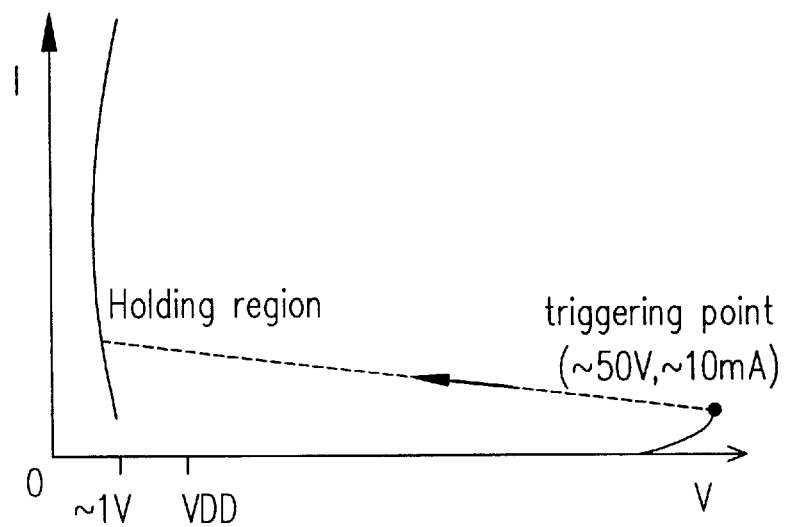
FIG. 2 is a graph showing the current-voltage relationship of the LSCR in FIG. 1.
Figure 3:
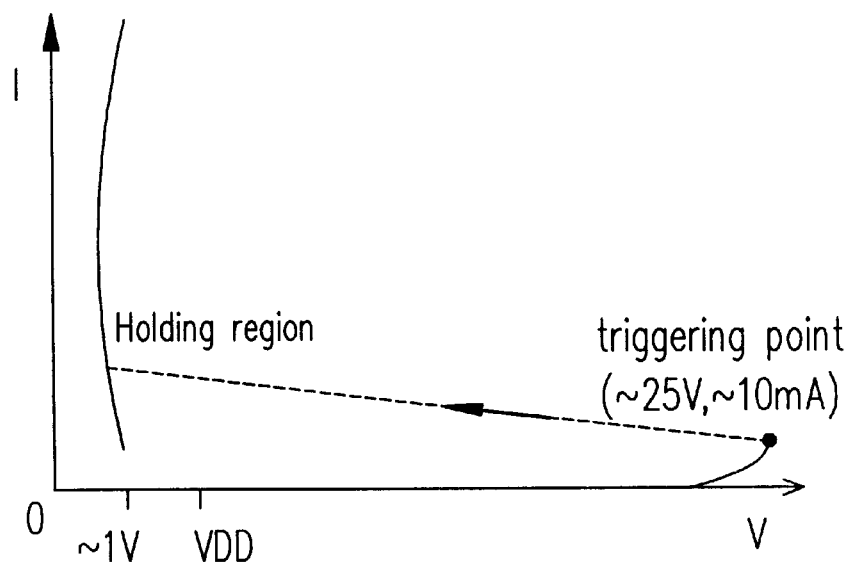
FIG. 3 is a graph showing the current-voltage relationship of a MLSCR.
Figure 4:
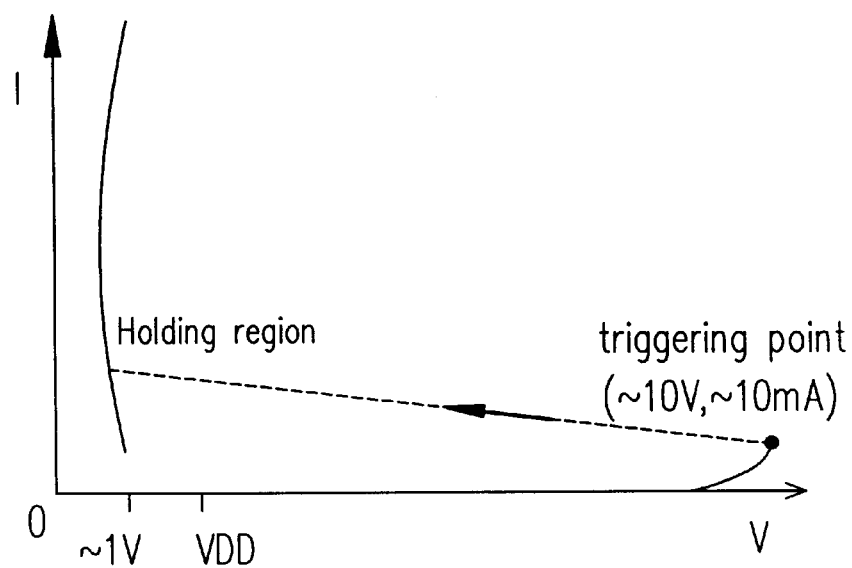
FIG. 4 is a graph showing the current-voltage relationship of a LVTSCR.

Reference will now be made in detail to the present preferred embodiments of the invention, examples of which are illustrated in the accompanying drawings. Wherever possible, the same reference numbers are used in the drawings and the description to refer to the same or like parts.

Figure 5:
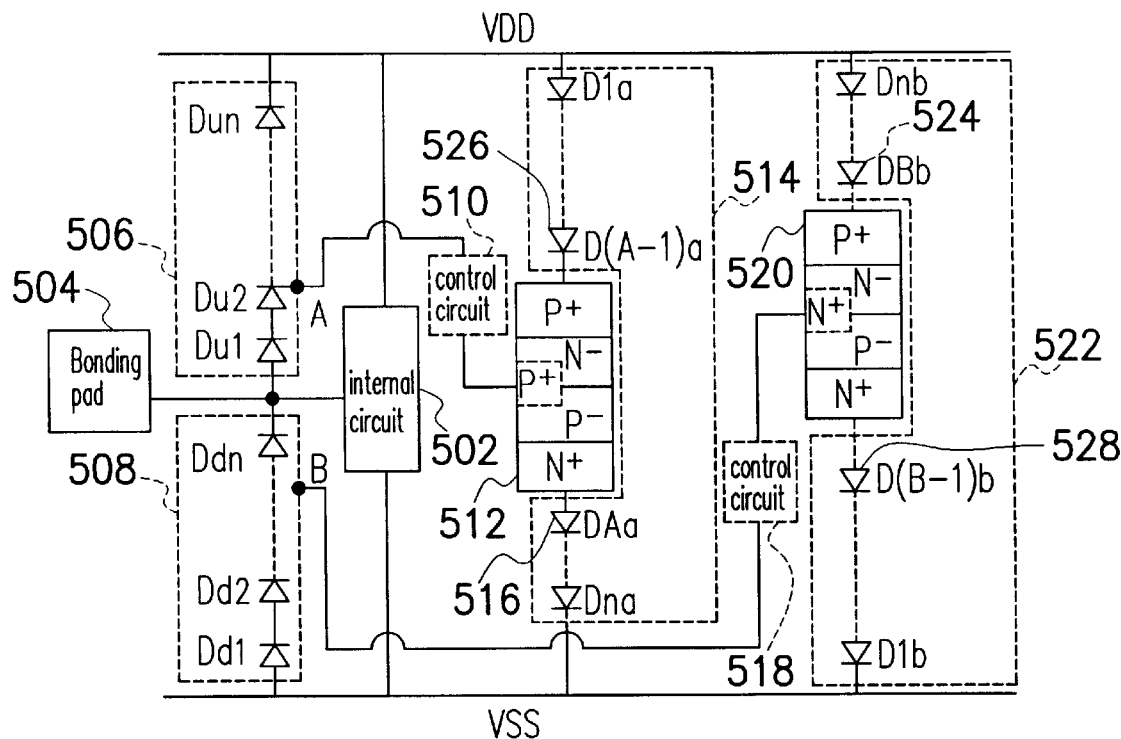
FIG. 5 is a diagram showing a low capacitance ESD protection circuit for a built-in CMOS chip according to a first preferred embodiment of this invention.

FIG. 5 is a diagram showing a low capacitance ESD protection circuit for a built-in CMOS chip according to a first preferred embodiment of this invention. As shown in FIG. 5, the ESD protection circuit protects an internal circuit 502 within a silicon chip (not shown). The ESD protection circuit is coupled to a bonding pad 504 and the internal circuit 502.

The ESD protection circuit includes a first diode series 506, a second diode series 508, a first control circuit 510, a first silicon-controlled rectifier (SCR) 512, a third diode series 514, a second silicon-controlled rectifier (SCR) 516, a second control circuit 518, a third silicon-controlled rectifier 520 and a fourth diode series 522. The diode series 506 comprises of n serially connected diodes (indicated by Du1, Du2, . . . , Dun in FIG. 5). The negative terminal of the diode series 506 is coupled to a voltage source VDD terminal and the positive terminal of the diode series 506 is coupled to the bonding pad 504. The diode series 508 comprises of n serially connected diodes (indicated by Dd1, Dd2, . . . , Ddn in FIG. 5). The negative terminal of the diode series 508 is coupled to the positive terminal of the diode series 506 and the positive terminal of the diode series 508 is coupled to a voltage source VSS termninal (that is, connected to ground). The control circuit 510 is coupled between the positive terminal of one of the diodes in the diode series 506 and the triggering terminal of the silicon controlled rectifier 512. When an electrostatic discharge (ESD) event occurs, the control circuit 510 outputs a triggering current to the triggering terminal of the SCR 512. The diode series 514 comprises of n serially connected diodes (indicated by D1$a$, D2$a$, ..., Dn$a$ in FIG. 5). The positive terminal of the diode series 514 is coupled to the voltage source VDD terminal and the negative terminal of the diode series 514 is coupled to a voltage source VSS terminal. The anode node of the SCR 512 is coupled to the negative terminal of the $(A-1)^{th}$ diode 526 (as shown in FIG. 5 by D(A−1)a) of the diode series 514 and the cathode node of the SCR 512 is coupled to the positive terminal of the $A^{th}$ diode 516 (as shown in FIG. 5 by DAa) of the diode series 514. The control circuit 518 is coupled between the positive terminal of one of the diodes (not shown) of the diode series 508 and the triggering terminal of the SCR 520. When an ESD occurs, the control circuit 518 outputs a triggering current to the triggering terminal of the SCR 520. The diode series 522 comprises of n serially connected diodes (indicated by D1$b$, D2$b$, ..., Dn$b$ in FIG. 5). The negative terminal of the diode series 522 is coupled to a voltage source VSS terminal. The anode node of the SCR 520 is coupled to the negative terminal of the $B^{th}$ diode 524 (as shown in FIG. 5 by DBb) of the diode series 522. The triggering terminal of the SCR 520 receives the triggering current submitted by the control circuit 518. The cathode node of the SCR 520 is coupled to the positive terminal of the $(B-1)^{th}$ diode 528 (as shown in FIG. 5 by D(B−1)b) of the diode series 522.

The silicon-controlled rectifier (SCR) 512 includes four doped layers $P^+$-$N^-$-$P^{31}$ -$N^+$ from the anode node to the cathode node and an additional $P^+$ layer is also formed between the $N^-$-$P^-$ layers. The $P^+$ layer is the triggering terminal of the SCR 512. Similarly, the silicon-controlled rectifier (SCR) 520 includes four doped layers $P^+$-$N^-$-$P^-$-$N^+$ from the anode node to the cathode node and an additional $N^+$ layer is also formed between the $N^-$-$P^-$ layers. The $N^+$ layer is the triggering terminal of the SCR 520.

Figure 6:
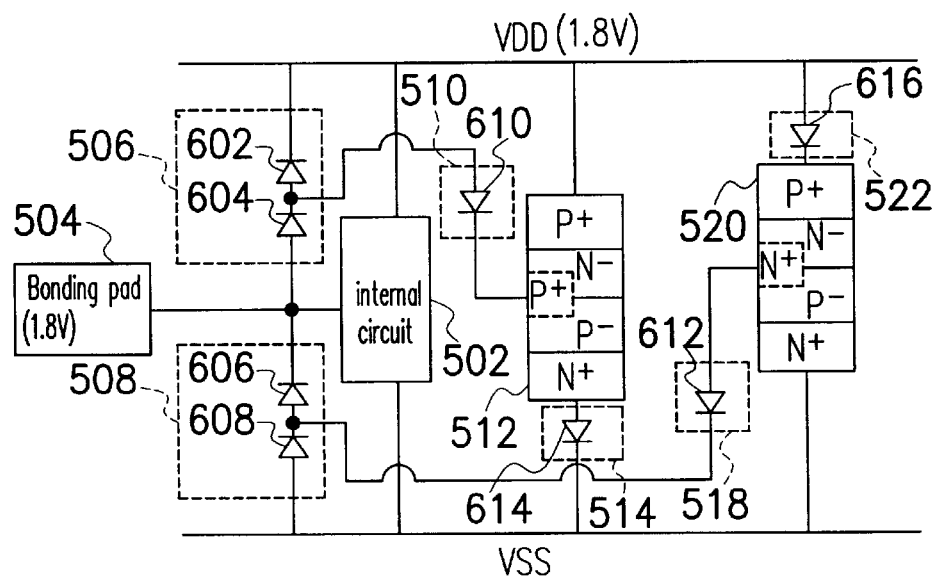
FIG. 6 is a circuit diagram showing a first application of the ESD protection circuit shown in FIG. 5.

In FIG. 5, the first control circuit 512, the second control circuit 520, the first diode series 506, the second diode series 508, the third diode series 514 and the fourth diode series 522 may form different circuit assemblies for ESD protection. FIG. 6 is a circuit diagram showing a first application of the ESD protection circuit shown in FIG. 5. As shown in FIG. 6, the voltage source VDD is at 1.8V and the bonding pad 504 is also at 1.8V. A diode 602 and another diode 604 connect serially to form the diode series 506. The negative terminal of the diode 602 in the diode series 506 is coupled to the voltage source VDD terminal. The positive terminal of the diode 604 in the diode series 506 is coupled to the bonding pad 504. A diode 606 and another diode 608 connect serially to form the diode series 508. The negative terminal of the diode 606 in the diode series 508 is coupled to the positive terminal of the diode 604. The positive terminal of the diode 608 in the diode series 508 is coupled to the voltage source VSS terminal. A diode 610 serving as the control circuit 510 is coupled between the positive terminal of the diode 602 and the triggering terminal of the SCR 512. A diode 612 serving as the control circuit 518 is coupled between the positive terminal of the diode 606 and the triggering terminal of the SCR 520. A diode 614 constitutes the diode series 514. The negative terminal of the diode 614 is coupled to the voltage source VSS terminal so that the anode node of the SCR 512 is coupled to the voltage source VDD terminal and the cathode node of the SCR 512 is coupled to the positive terminal of the diode 614. Similarly, a diode 616 constitutes the diode series 522. The positive terminal of the diode 616 is coupled to the voltage source VDD terminal so that the anode node of the SCR 520 is coupled to the negative terminal of the diode 616 and the cathode node of the SCR 520 is coupled to the voltage source VSS terminal.

When the integrated circuit (not shown) is under normal operation, the bonding pad 504 is at 1.8V. The positive and negative terminals of the diode series 506 are at equal potential. Hence, the diode series 506 will not be turned on. The negative terminal of the diode 508 has a potential identical to the bonding pad 504 and the positive terminal of the diode series 508 is at a zero volt. The diode series 508 is in reverse biased so that the diode series 508 is non-conductive. Since the triggering terminal of the SCR 512 receives no triggering current, the triggered voltage of the SCR 512 is higher than the operating voltage VDD and the SCR 512 remains off. Thus, no leakage current flows in the SCR 512. The triggering terminal of the SCR 520 receives also no triggering current. Hence, the triggered voltage of the SCR 520 is higher than the operating voltage VDD and the SCR 520 remains off. Again, no leakage current flows in the SCR 520. In brief, the SCR 512 and 520 for bypassing ESD current will not affect normal operation of the integrated circuit (not shown). Furthermore, the larger the number of diodes in the diode series (such as the diode series 506 and 508), the smaller will be the equivalent capacitance of all serially connected diodes. With the equivalent input capacitance seen from the bonding pad 504 greatly reduced, the ESD protection circuit can be applied to high frequency or radio frequency circuits.

When an electrostatic discharge between the bonding pad or output pad with respect to the voltage sources VDD and VSS occurs, actions induced in the ESD protection circuit depends on the operating mode. Possible modes of operation for the ESD circuit in FIG. 6 includes a PS mode (a positive voltage pulse relative to VSS is applied to the bonding pad 504), an NS mode (a negative voltage pulse relative to VSS is applied to the bonding pad 504), a PD mode (a positive pulse voltage relative to VDD is applied to the bonding pad 504), an ND mode (a negative pulse voltage relative to VDD is applied to the bonding pad) and a voltage source VDD terminal/voltage source VSS terminal operation mode.

In the PS mode, a positive voltage pulse appears at the bonding pad 504. Since the ESD voltage is greater than the voltage drop along the circuit path for diode 604-diode 610-$P^+/P^-/N^+$ of the SCR 512-diode 614 (the voltage drop of all four diodes), the diode 604, the diode 610, the $P^+/P^-/N^+$ of the SCR 512 and the diode 614 along the circuit all are turned on. Hence, the triggering terminal of the SCR 512 receives a triggering current so that the triggered voltage of the SCR 512 drops. In addition, because the ESD voltage is greater than all the voltage drop along the circuit path for diode 604-diode 602-SCR 512-diode 614 (voltage drop of three diodes and the triggered voltage of the SCR), the diode 604, the diode 602, the SCR 512 and the diode 614 all are turned on. The ESD current flows into two routes. One route goes through diode 604-diode 610-$P^+/P^-/N^+$ of SCR 512-diode 614. The other route goes through the diode 604, the diode 602, the SCR 512 and the diode 614. Thus, damage on the internal circuit 502 is surely avoided. After dumping the ESD current via the diode 604, the diode 602, the SCR 512 and the diode 614, the SCR 512 is immediately shut because the holding voltage of the SCR 512 together with the voltage drop across the diode 614 is now greater than the operating voltage VDD (VDD is now 1.8V).

In the NS mode, a negative voltage pulse appears at the bonding pad 504. Since the positive terminal of the diode series 508 is at zero volt and the negative terminal of the diode series 508 is at the negative pulse voltage, the diode series 508 is under forward biased. Hence, the negative voltage pulse is discharged through the diode series 508 and damages to the internal circuit 502 due to ESD are prevented.

In the PD mode, a positive voltage pulse appears at the bonding pad 504. Since the negative terminal of the diode series 506 is at zero voltage (voltage at the voltage terminal VDD can be regarded as zero during ESD transient) and the positive terminal of the diode series 506 receives the positive voltage pulse, the diode series 506 is under forward biased. Hence, the positive voltage pulse is discharged through the diode series 506 and damages to the internal circuit 502 due to ESD are greatly minimized.

In the ND mode, a negative voltage pulse appears at the bonding pad 504. Since the ESD voltage is greater than the voltage drop along the circuit path for diode 606-diode 612-$N^+/N^-/P^+$ of the SCR 520-diode 616 (the voltage drop of all four diodes), the diode 606, the diode 612, the $N^+/N^-/P^+$ of the SCR 520 and the diode 616 along the circuit all are turned on. Hence, the triggering terminal of the SCR 520 receives a triggering current so that the triggered voltage of the SCR 520 drops. In addition, because the ESD voltage is greater than all the voltage drop along the circuit path for diode 606-diode 608-SCR 520-diode 616 (voltage drop of three diodes and the triggered voltage of the SCR), the diode 606, the diode 608, the SCR 520 and the diode 616 all are turned on. The ESD current flows into two routes. One route goes through diode 606-diode 611-$N^+/N^-/P^+$ of SCR 520-diode 616. The other route goes through the diode 606, the diode 608, the SCR 520 and the diode 616. Thus, damage on the internal circuit 502 is surely avoided. After dumping the ESD current via the diode 606, the diode 608, the SCR 520 and the diode 616, the holding voltage of the SCR 520 together with the voltage drop across the diode 616 is now greater than the operating voltage VDD (VDD is now 1.8V). When the SCR 520 and the diode 616 under the normal working status are triggered to be turned on by the instant noise, a latch does not occur causing a large current. Hence, the SCR is shut.

In the voltage source VDD terminal/voltage source VSS terminal mode, a positive voltage pulse appears at the voltage source VDD terminal. Since the ESD voltage is greater than the voltage drop along the circuit path for diode 612-$P^+/N^-/N^+$ of the SCR 520-diode 612-diode 606-diode 604-diode 610-$P^+/P^-/N^+$ of the SCR 512-diode 614 (the voltage drop of all eight diodes), the diode 612, the $P^+/N^-/N^+$ of the SCR 520, the diode 612, the diode 606, the diode 604, the diode 610, the $P^+/P^-/N^+$ of the SCR 512 and the diode 614 all are turned on. Hence, the triggering terminal of the SCR 512 receives a triggering current so that the triggered voltage of the SCR 512 drops. In addition, because the ESD voltage is greater than the voltage drop across the SCR 512 and the diode 614 (the voltage drop of one diode and the triggered voltage of a SCR), the SCR 512 and the diode 614 are turned on. Hence, most of ESD current is released through the SCR 512 and the diode 614 and possible damages to the internal circuit 502 are minimized. After dumping the ESD current via the SCR 512 and the diode 614, the SCR 512 is immediately shut because the holding voltage of the SCR 512 together with the voltage drop across the diode 614 is now greater than the operating voltage VDD (VDD is now 1.8V).

Figure 7:
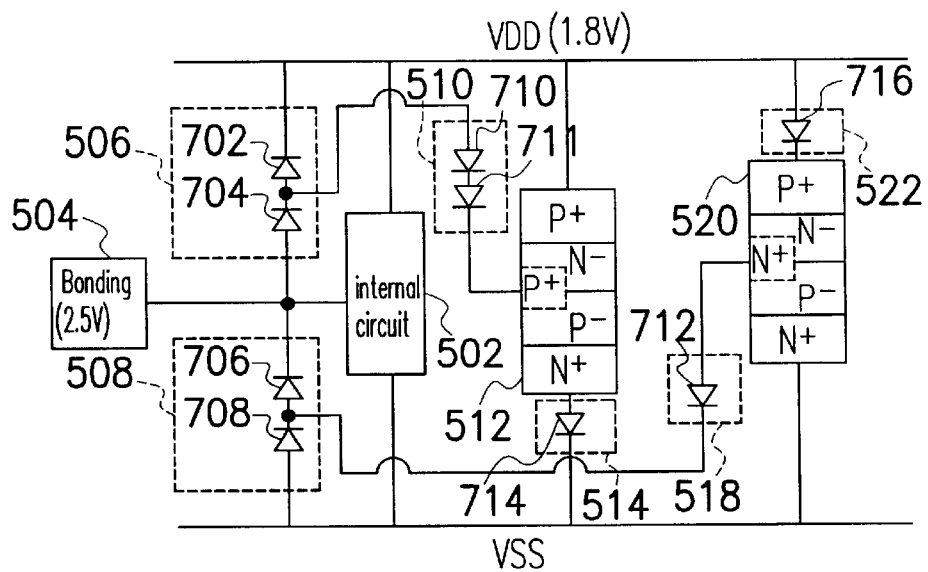
FIG. 7 is a circuit diagram showing a second application of the ESD protection circuit shown in FIG. 5.

FIG. 7 is a circuit diagram showing a second application of the ESD protection circuit shown in FIG. 5. As shown in FIG. 7, the voltage source VDD is at 1.8V and the bonding pad 504 is also at 2.5V. A diode 702 and another diode 704 connect serially to form the diode series 506. The negative terminal of the diode 702 in the diode series 506 is coupled to the voltage source VDD terminal. The positive terminal of the diode 704 in the diode series 506 is coupled to the bonding pad 504. A diode 706 and another diode 708 connect serially to form the diode series 508. The negative terminal of the diode 706 in the diode series 508 is coupled to the positive terminal of the diode 704. The positive terminal of the diode 708 in the diode series 508 is coupled to the voltage source VSS terminal. A pair of serially connected diodes 710 and 711 serves as the control circuit 510. The positive terminal of the diode 710 in the control circuit 510 is coupled to the positive terminal of the diode 702. The negative terminal of the diode 711 in the control circuit 510 is coupled to the triggering terminal of the SCR 512. A diode 712 serving as the control circuit 518 is coupled between the positive terminal of the diode 706 and the triggering terminal of the SCR 520. A diode 714 constitutes the diode series 514. The negative terminal of the diode 714 is coupled to the voltage source VSS terminal so that the anode node of the SCR 512 is coupled to the voltage source VDD terminal and the cathode node of the SCR 512 is coupled to the positive terminal of the diode 714. Similarly, a diode 716 constitutes the diode series 522. The positive terminal of the diode 716 is coupled to the voltage source VDD terminal so that the anode node of the SCR 520 is coupled to the negative terminal of the diode 716 and the cathode node of the SCR 512 is coupled to the voltage source VSS terminal.

When the integrated circuit (not shown) is operating normally, the bonding pad 504 is at 2.5V and the operating voltage VDD is at 1.8V. Since the sum of the voltage drop across the diode series 506 and the operating voltage VDD is greater than the potential at the bonding pad 504, the diode series 506 remains non-conductive. Moreover. the sum of the voltage drop across the diodes 704, 710, 711 and 714 is greater than the potential at the bonding pad 504. Hence, the triggering terminal of the SCR 512 receives no triggering current. The negative terminal of the diode series 508 has a voltage identical to the bonding pad 504 and the positive terminal of the diode series 508 is at zero volts. Since the diode series 508 is in reverse biased, the diode series 508 remains non-conductive. Since the triggering terminal of the SCR 512 receives no triggering current, the triggered voltage of the SCR 512 is higher than the operating voltage VDD and the SCR 512 remains non-conductive. Thus, no leakage current flows in the SCR 512. The triggering terminal of the SCR 520 also receives no triggering current. Hence, the triggered voltage of the SCR 520 is higher than the operating voltage VDD and the SCR 520 remains non-conductive. Again, no leakage current flows in the SCR 520. In brief, the SCR 512 and 520 for bypassing ESD current will not affect normal operation of the integrated circuit (not shown). Furthermore, the larger the number of diodes in the diode series (such as the diode series 506 and 508), the smaller will be the equivalent capacitance of all serially connected diodes. With the equivalent input capacitance seen from the bonding pad 504 greatly reduced, the ESD protection circuit can be applied to high frequency or radio frequency circuits.

When an electrostatic discharge between the bonding pad or output pad with respect to the voltage sources VDD and VSS occurs, actions induced in the ESD protection circuit depends on the operating mode. Possible modes of operation for the ESD circuit in FIG. 7 include a PS mode, an NS mode, a PD mode, an ND mode and a voltage source VDD terminal/voltage source VSS terminal mode.

In the PS mode, a positive voltage pulse appears at the bonding pad 504. Since the ESD voltage is greater than the voltage drop along the circuit path for diode 704-diode 710-diode 711-P$^+$/P$^-$/N$^+$ of the SCR 512-diode 714 (the voltage drop of all five diodes), the diode 704, the diode 710. the diode 711, the P$^+$/P$^-$/N$^+$ of the SCR 512 and the diode 714 along the circuit all are turned on. Hence, the triggering terminal of the SCR 512 receives a triggering current so that the triggered voltage of the SCR 512 drops. In addition, because the ESD voltage is greater than all the voltage drop along the circuit path for diode 704-diode 702-SCR 512-diode 714 (voltage drop of three diodes and the triggered voltage of the SCR), the diode 704, the diode 702, the SCR 512 and the diode 714 all are turned on. The ESD current flows into two routes. One route goes through diode 704-diode 710-diode 711-P$^+$/P$^-$/N$^+$ of SCR 512-diode 714. The other route goes through the diode 704, the diode 702, the SCR 512 and the diode 714. Thus, damage on the internal circuit 502 is surely avoided. After dumping the ESD current via the diode 704, the diode 702, the SCR 512 and the diode 714, the SCR 512 is immediately shut because the holding voltage of the SCR 512 together with the voltage drop across the diode 714 is now greater than the operating voltage VDD (VDD is now 1.8V).

In the NS mode, a negative voltage pulse appears at the bonding pad 504. Since the positive terminal of the diode series 508 is at zero volts and the negative terminal of the diode series 508 receives the negative pulse voltage, the diode series 508 is under forward biased. Hence, the negative voltage pulse is discharged through the diode series 508 and damages to the internal circuit 502 due to ESD are prevented.

In the PD mode, a positive voltage pulse appears at the bonding pad 504. Since the negative terminal of the diode series 506 is at zero voltage (voltage at the voltage terminal VDD can be regarded as zero during ESD transient) and the positive terminal of the diode series 506 receives the positive voltage pulse, the diode series 506 is under forward biased. Hence, the positive voltage pulse is discharged through the diode series 506 and damages to the internal circuit 502 due to ESD are greatly minimized.

In the ND mode, a negative voltage pulse appears at the bonding pad 504. Since the ESD voltage is greater than the voltage drop along the circuit path for diode 706-diode 712-N$^+$/N$^-$/P$^+$ of the SCR 520-diode 716 (the voltage drop of all four diodes), the diode 706, the diode 712, the N$^+$/N$^-$/P$^+$ of the SCR 520 and the diode 716 along the circuit all are turned on. Hence, the triggering terminal of the SCR 520 receives a triggering current so that the triggered voltage of the SCR 520 drops. In addition, because the ESD voltage is greater than all the voltage drop along the circuit path for diode 706-diode 708-SCR 520-diode 716 (voltage drop of three diodes and the triggered voltage of the SCR), the diode 706, the diode 708, the SCR 520 and the diode 716 all are turned on. The ESD current flows into two routes. One route goes through diode 706-diode 712-N/N/P of SCR 512-diode 716. The other route goes through the diode 706, the diode 708, the SCR 520 and the diode 716. Thus, damage on the internal circuit 502 is surely avoided. After dumping the ESD current via the diode 706, the diode 708, the SCR 520 and the diode 716, the SCR 520 is immediately shut because the holding voltage of the SCR 520 together with the voltage drop across the diode 716 is now greater than the operating voltage VDD (VDD is now 1.8V).

In the voltage source VDD terminal/voltage source VSS terminal mode, a positive voltage pulse appears at the voltage source VDD terminal. Since the ESD voltage is greater than the voltage drop along the circuit path for diode 716-P$^+$/N$^-$/N$^+$ of the SCR 520-diode 712-diode 706-diode 704-diode 710-diode 711-P$^+$/P$^-$/N$^+$ of the SCR 512-diode 714 (the voltage drop of all nine diodes), the diode 716, the P$^+$/N$^-$/N$^+$ of the SCR 520, the diode 712, the diode 706, the diode 704, the diode 710, the diode 711, the P$^+$/P$^-$/N$^+$ of the SCR 512 and the diode 714 all are turned on. Hence, the triggering terminal of the SCR 512 receives a triggering current so that the triggered voltage of the SCR 512 drops. In addition, because the ESD voltage is greater than the voltage drop across the SCR 512 and the diode 714 (the voltage drop of one diode and the triggered voltage of a SCR), the SCR 512 and the diode 714 conduct. Hence, ESD current is released through the SCR 512 and the diode 714 and possible damages to the internal circuit 502 are minimized. After dumping the ESD current via the SCR 512 and the diode 714, the SCR 512 is immediately shut because the holding voltage of the SCR 512 together with the voltage drop across the diode 714 is now greater than the operating voltage VDD (VDD is now 1.8 V).

Figure 8:
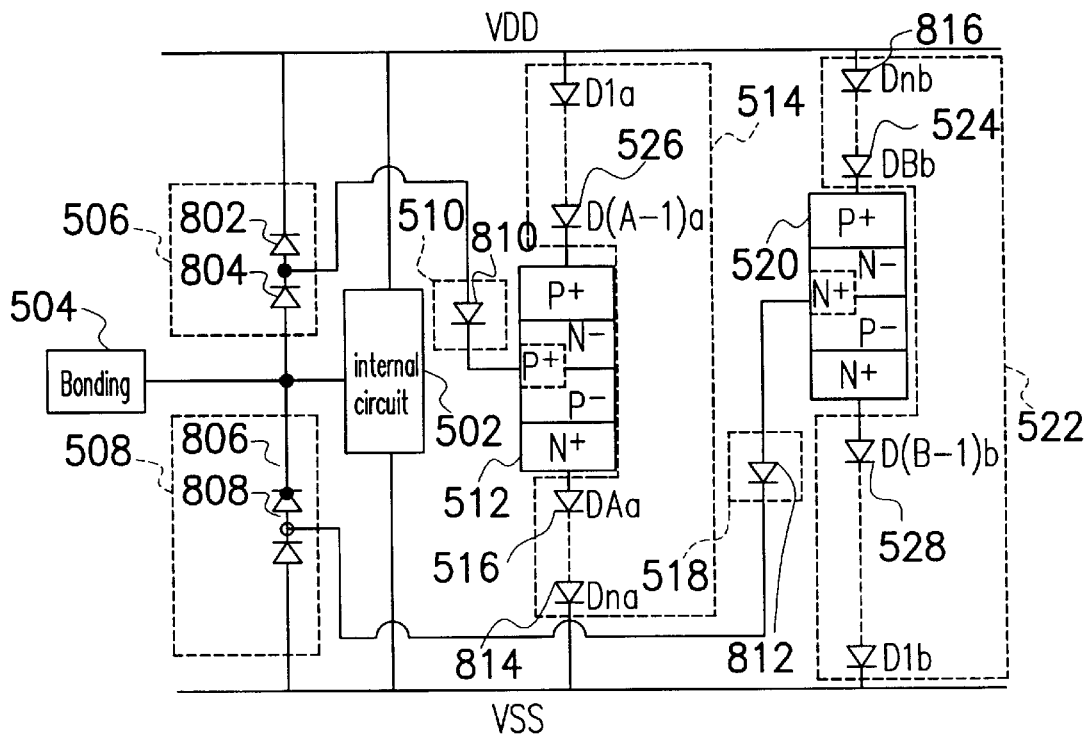
FIG. 8 is a circuit diagram showing a third application of the ESD protection circuit shown in FIG. 5.

FIG. 8 is a circuit diagram showing a third application of the ESD protection circuit shown in FIG. 5. In FIG. 8, a diode 802 and another diode 804 connect serially to form the diode series 506. The negative terminal of the diode 802 in the diode series 506 is coupled to the voltage source VDD terminal. The positive terminal of the diode 804 in the diode series 506 is coupled to the bonding pad 504. A diode 806 and another diode 808 connect serially to form the diode series 508. The negative terminal of the diode 806 in the diode series 508 is coupled to the positive terminal of the diode 804. The positive terminal of the diode 808 in the diode series 508 is coupled to the voltage source VSS terminal. A diode 810 serves as the control circuit 510. The diode 810 in the control circuit 510 is coupled between the positive terminal of the diode 802 and the triggering terminal of the SCR 512. A diode 812 serving as the control circuit 518 is coupled between the positive terminal of the diode 806 and the triggering terminal of the SCR 520.

When the integrated circuit (not shown) is operating normally, the sum of the voltage drop across the diode series 506 and the operating voltage VDD is greater than the potential at the bonding pad 504. Hence, the diode series 506 remains non-conductive. The negative terminal of the diode series 508 has a voltage identical to the bonding pad 504 and the positive terminal of the diode series 508 is at zero volts. The diode series 508 is in reverse biased and hence the diode series 508 remains non-conductive. Since the triggering terminal of the SCR 512 receives no triggering current, the triggered voltage of the SCR 512 is higher than the operating voltage VDD and the SCR 512 remains non-conductive. Thus, no leakage current flows in the SCR 512. The triggering terminal of the SCR 520 also receives no triggering current. Hence, the triggered voltage of the SCR 520 is higher than the operating voltage VDD and the SCR 520 remains non-conductive. Again, no leakage current flows in the SCR 520. In brief, the SCR 512 and 520 for bypassing ESD current will not affect normal operation of the integrated circuit (not shown). Furthermore, the larger the number of diodes in the diode series (such as the diode series 506 and 508), the smaller will be the equivalent capacitance of all serially connected diodes. With the equivalent input capacitance seen from the bonding pad 504 greatly reduced, the ESD protection circuit can be applied to high frequency or radio frequency circuits.

When an electrostatic discharge between the bonding pad or output pad with respect to the voltage sources VDD and VSS occurs, actions induced in the ESD protection circuit depends on the operating mode. Possible modes of operation for the ESD circuit in FIG. 8 include a PS mode, an NS mode, a PD mode, an ND mode and a voltage source VDD terminal/voltage source VSS terminal mode.

In the PS mode, a positive voltage pulse appears at the bonding pad 504. Since the ESD voltage is greater than the voltage drop along the circuit path for diode 804-diode 810-$P^+/P^-/N^+$ of the SCR 512-diode DAa 516 to Dna 814, the diode 804, the diode 810, the $P^+/P^-/N^+$ of the SCR 512 and the diode DAa 516 to Dna 814 along the circuit all are turned on. Hence, the triggering terminal of the SCR 512 receives a triggering current so that the triggered voltage of the SCR 512 drops. In addition, because the ESD voltage is greater than all the voltage drops along the circuit path for diode 804-diode 802-diode series 514-SCR 512, the diode 804, the diode 802, the diode series 514 and the SCR 512 all are turned on. The ESD current flows into two routes. One route goes through diode 804-diode 810-$P^+/P^{31}/N^+$ of SCR 512-diode DAa 516 to diode Dna 814. The other route goes through the diode 806, the diode 802, the diode series, the SCR 512. Thus, damage on the internal circuit 502 is surely avoided. After dumping the ESD current via the diode 804, the diode 802, the diode series 514 and the SCR 512, the SCR 512 is immediately shut because the holding voltage of the SCR 512 together with the voltage drop across the diode series 514 is now greater than the operating voltage VDD.

In the NS mode, a negative voltage pulse appears at the bonding pad 504. Since the positive terminal of the diode series 508 is at zero volts and the negative terminal of the diode series 508 receives the negative pulse voltage, the diode series 508 is under forward biased. Hence, the negative voltage pulse is discharged through the diode series 508 and damages to the internal circuit 502 due to ESD are prevented.

In the PD mode, a positive voltage pulse appears at the bonding pad 504. Since the negative terminal of the diode series 506 is at zero voltage (voltage at the voltage terminal VDD can be regarded as zero during ESD transient) and the positive terminal of the diode series 506 receives the positive voltage pulse, the diode series 506 is under forward biased. Hence, the positive voltage pulse is discharged through the diode series 506 and damages to the internal circuit 502 due to ESD are greatly minimized.

In the ND mode, a negative voltage pulse appears at the bonding pad 504. Since the ESD voltage is greater than the voltage drop along the circuit path for diode 806-diode 812-$N^+/N^-/P^+$ of the SCR 520-diode Dnb 816 (the voltage drop of all four diodes), the diode 806, the diode 812, the $N^+/N^-/P^+$ of the SCR 520 and the diode Dnb 816 along the circuit all are turned on. Hence, the triggering terminal of the SCR 520 receives a triggering current so that the triggered voltage of the SCR 520 drops. In addition, because the ESD voltage is greater than all the voltage drops along the circuit path for diode 806-diode 808-diode series 522-SCR 520, the diode 806, the diode 808, the diode series 522 and the SCR 520 all are turned on. The ESD current flows into two routes. One route goes through diode 806-diode 812-$N^+/N^-/P^+$ of SCR 520-diode DBb 524 to diode Dnb 816. The other route goes through the diode 806, the diode 808, the diode series 522, and the SCR 520. Thus, damage on the internal circuit 502 is surely avoided. After dumping the ESD current via the diode 806, the diode 808, the diode series 522 and the SCR 520, the SCR 520 is immediately shut because the holding voltage of the SCR 520 together with the voltage drop across the diode series 522 is now greater than the operating voltage VDD.

In the voltage source VDD terminal/voltage source VSS terminal mode, a positive voltage pulse appears at the voltage source VDD terminal. Since the ESD voltage is greater than the voltage drop along the circuit path for diode Dnb 816-diode DBb 524-$P^+/N^-/N^+$ of the SCR 520-diode 812-diode 806-diode 804-diode 810-$P^+/P^-/N^+$ of the SCR 512-diode DAa 516 to Dna 814, all the diode Dnb 816 to diode DBb 524, the $P^+/N^-/N^+$ of the SCR 520, the diode 812, the diode 806, the diode 804, the diode 810, the $P^+/P^-/N^+$ of the SCR 512 and the diode Daa 516 to the diode Dna 814 conduct. Hence, the triggering terminal of the SCR 512 receives a triggering current so that the triggered voltage of the SCR 512 drops. In addition, because the ESD voltage is greater than the voltage drop across the SCR 512 and the diode series 514, the SCR 512 and the diode series 514 conduct. Hence, ESD current is discharged through the SCR 512 and the diode series 514 and possible damages to the internal circuit 502 are minimized. After dumping the ESD current via the SCR 512 and the diode series 514, the SCR 512 is immediately shut because the holding voltage of the SCR 512 together with the voltage drop across the diode series 514 is now greater than the operating voltage VDD.

Figure 9:
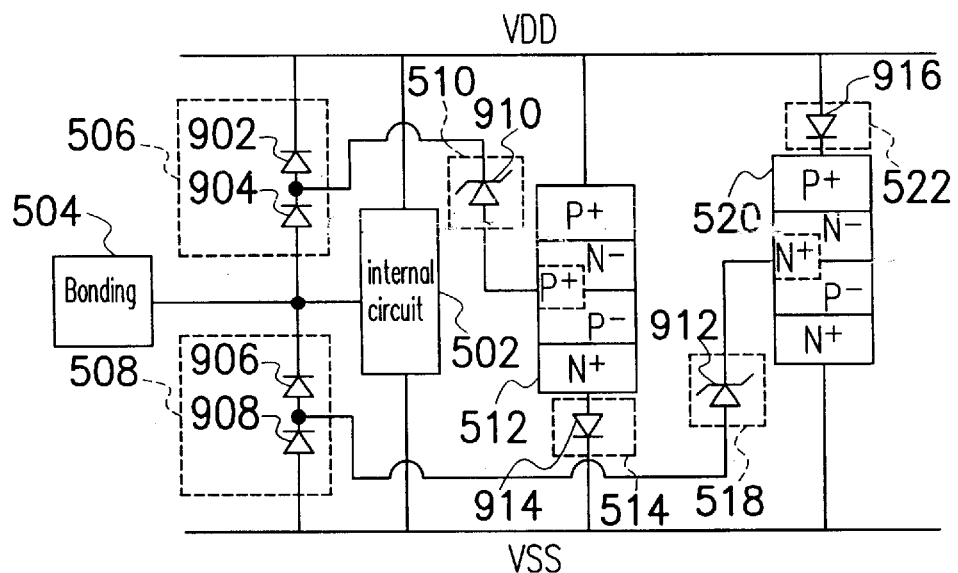
FIG. 9 is a circuit diagram showing a fourth application of the ESD protection circuit shown in FIG. 5.

FIG. 9 is a circuit diagram showing a fourth application of the ESD protection circuit shown in FIG. 5. In FIG. 9, a diode 902 and another diode 904 connect serially to form the diode series 506. The negative terminal of the diode 902 in the diode series 506 is coupled to the voltage source VDD terminal. The positive terminal of the diode 904 in the diode series 506 is coupled to the bonding pad 504. A diode 906 and another diode 908 connect serially to form the diode series 508. The negative terminal of the diode 906 in the diode series 508 is coupled to the positive terminal of the diode 904. The positive terminal of the diode 908 in the diode series 508 is coupled to the voltage source VSS terminal. A Zener diode 910 serves as the control circuit 510. The Zener diode 910 in the control circuit 510 is coupled between the positive terminal of the diode 902 and the triggering terminal of the SCR 512. A Zener diode 912 serving as the control circuit 518 is coupled between the positive terminal of the diode 906 and the triggering terminal of the SCR 520. A diode 914 constitutes the diode series 514. The negative terminal of the diode 914 is coupled to the voltage source VSS terminal so that the anode node of the SCR 512 is coupled to the voltage source VDD terminal and the cathode node of the SCR 512 is coupled to the positive terminal of the diode 914. Similarly, a diode 916 constitutes the diode series 522. The positive terminal of the diode 916 is coupled to the voltage source VDD terminal so that the anode node of the SCR 520 is coupled to the negative terminal of the diode 916 and the cathode node of the SCR 512 is coupled to the voltage source VSS terminal.

When the integrated circuit (not shown) is operating normally, the sum of the voltage drop across the diode series 506 and the operating voltage VDD is greater than the potential at the bonding pad 504. Hence, the diode series 506 remains non-conductive. The negative terminal of the diode series 508 has a voltage identical to the bonding pad 504 and the positive terminal of the diode series 508 is at zero volts. The diode series 508 is in reverse biased and hence the diode series 508 remains non-conductive. Since the triggering terminal of the SCR 512 receives no triggering current, the triggered voltage of the SCR 512 is higher than the operating voltage VDD and the SCR 512 remains non-conductive. Thus, no leakage current flows in the SCR 512. The triggering terminal of the SCR 520 also receives no triggering current. Hence, the triggered voltage of the SCR 520 is higher than the operating voltage VDD and the SCR 520 remains non-conductive. Again, no leakage current flows in the SCR 520. In brief, the SCR 512 and 520 for bypassing ESD current will not affect normal operation of the integrated circuit (not shown). Furthermore, the larger the number of diodes in the diode series (such as the diode series 506 and 508), the smaller will be the equivalent capacitance of all serially connected diodes. With the equivalent input capacitance seen from the bonding pad 504 greatly reduced, the ESD protection circuit can be applied to high frequency or radio frequency circuits.

When an electrostatic discharge between the bonding pad or output pad with respect to the voltage sources VDD and VSS occurs, actions induced in the ESD protection circuit depends on the operating mode. Possible modes of operation for the ESD circuit in FIG. 9 include a PS mode, an NS mode, a PD mode, an ND mode and a voltage source VDD terminal/voltage source VSS terminal mode.

In the PS mode, a positive voltage pulse appears at the bonding pad 504. Since the ESD voltage is greater than the voltage drop along the circuit path for diode 904-Zener diode 910-$P^+/P^-/N^+$ of the SCR 512-diode 914 (the voltage drop of three diodes and a Zener diode in reverse biased), the diode 904, the Zener diode 910, the $P^+/P^-/N^+$ of the SCR 512 and the diode 914 along the circuit all are turned on. Hence, the triggering terminal of the SCR 512 receives a triggering current so that the triggered voltage of the SCR 512 drops. In addition, because the ESD voltage is greater than all the voltage drops along the circuit path diode 904, diode 902, SCR 512 and diode 914 (the voltage drop of three diodes and triggered voltage of the SCR), the diode 904, the diode 902, the SCR 512 and the diode 914 all are turned on. The ESD current flows into two routes. One route goes through diode 904-Zener diode 910-$P/P^-/N$ of SCR 512-diode 914. The other route goes through the diode 904, the diode 902, the SCR 512 and the diode 914. Thus, damage on the internal circuit 502 is surely avoided. After dumping the ESD current via the diode 904, the diode 902, the SCR 512 and the diode 914, the SCR 512 is immediately shut because the holding voltage of the SCR 512 together with the voltage drop across the diode 914 is now greater than the operating voltage VDD.

In the NS mode, a negative voltage pulse appears at the bonding pad 504. Since the positive terminal of the diode series 508 is at zero volts and the negative terminal of the diode series 508 receives the negative pulse voltage, the diode series 508 is under forward biased. Hence, the negative voltage pulse is discharged through the diode series 508 and damages to the internal circuit 502 due to ESD are prevented.

In the PD mode, a positive voltage pulse appears at the bonding pad 504. Since the negative terminal of the diode series 506 is at zero voltage (voltage at the voltage terminal VDD can be regarded as zero during ESD transient) and the positive terminal of the diode series 506 receives the positive voltage pulse, the diode series 506 is under forward biased. Hence, the positive voltage pulse is discharged through the diode series 506 and damages to the internal circuit 502 due to ESD are greatly minimized.

In the ND mode, a negative voltage pulse appears at the bonding pad 504. Since the ESD voltage is greater than the voltage drop along the circuit path for diode 906-Zener diode 912-$N^+/N^-/P^+$ of the SCR 520-diode 916 (the voltage drop of three diodes and one Zener diode in reverse biased), the diode 906, the Zener diode 912, the $N^+/N^-/P^+$ of the SCR 520 and the diode 916 along the circuit all are turned on. Hence, the triggering terminal of the SCR 520 receives a triggering current so that the triggered voltage of the SCR 520 drops. In addition, because the ESD voltage is greater than all the voltage drops along the circuit path diode 906-diode 908-SCR 520-diode 916 (the voltage drop of three diodes and the triggered voltage of the SCR), the diode 906, the diode 908, the SCR 520 and the diode 916 all are turned on. The ESD current flows into two routes. One route goes through diode 906-Zener diode 912-$N/N^-/P$ of SCR 520-diode 916. The other route goes through the diode 906, the diode 908, the SCR 520 and the diode 916. Thus, damage on the internal circuit 502 is surely avoided. After dumping the ESD current via the diode 906, the diode 908, the SCR 520 and the diode 916, the SCR 520 is immediately shut because the holding voltage of the SCR 520 together with the voltage drop across the diode 916 is now greater than the operating voltage VDD.

In the voltage source VDD terminal/voltage source VSS terminal mode, a positive voltage pulse appears at the voltage source VDD terminal. Since the ESD voltage is greater than the voltage drop along the circuit path for diode 916-$P^+/N^-/N^+$ of the SCR 520-Zener diode 912-diode 906-diode 904-Zener diode 910-$P^+/P^-/N^+$ of the SCR 512-diode 914 (the voltage drop of six diodes and two Zener diodes in reverse biased), the diode 916, the $P^+/N^-/N^+$ of the SCR 520, the Zener diode 912, the diode 906, the diode 904, the Zener diode 910, the $P^+/P^-/N^+$ of the SCR 512 and the diode 914 all are turned on. Hence, the triggering terminal of the SCR 512 receives a triggering current so that the triggered voltage of the SCR 512 drops. In addition, because the ESD voltage is greater than the voltage drop across the SCR 512 and the diode 914 (the voltage drop of one diode and the triggered voltage of the SCR), the SCR 512 and the diode 914 conduct. Hence, ESD current is discharged through the SCR 512 and the diode 914 and possible damages to the internal circuit 502 are minimized. After dumping the ESD current via the SCR 512 and the diode 914, the SCR 512 is immediately shut because the holding voltage of the SCR 512 together with the voltage drop across the diode 914 is now greater than the operating voltage VDD.

Figure 10:
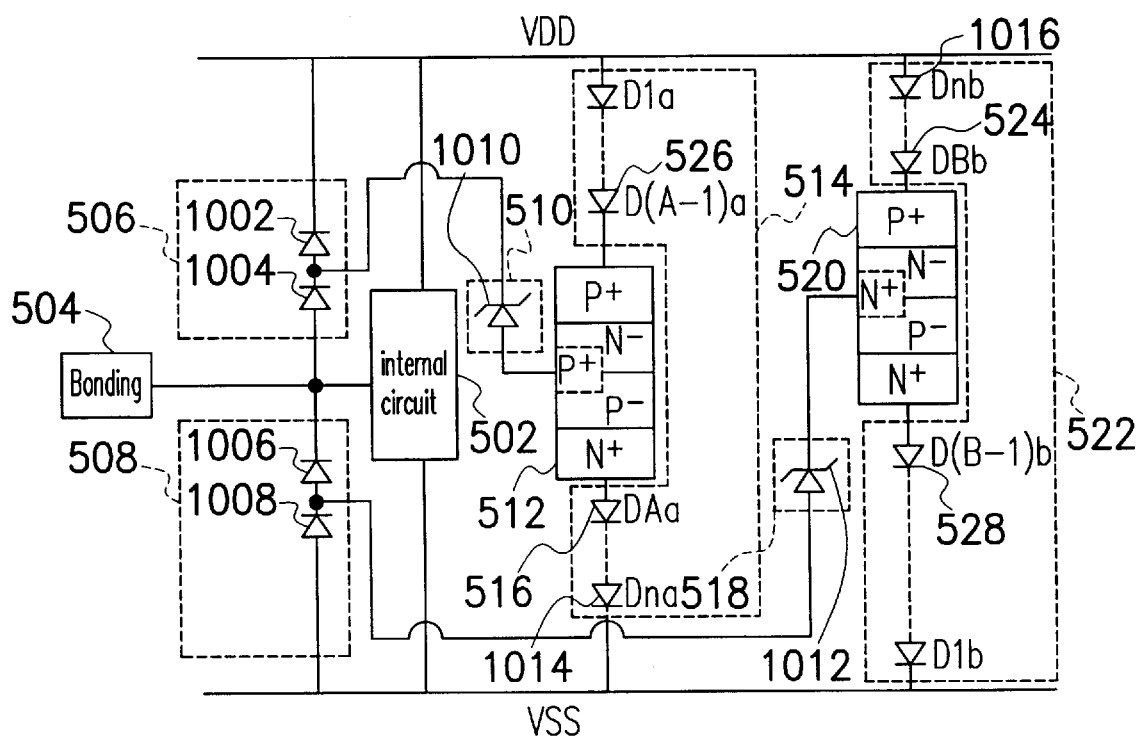
FIG. 10 is a circuit diagram showing a fifth application of the ESD protection circuit shown in FIG. 5.

FIG. 10 is a circuit diagram showing a fifth application of the ESD protection circuit shown in FIG. 5. In FIG. 10, a diode 1002 and another diode 1004 connect serially to form the diode series 506. The negative terminal of the diode 802 in the diode series 506 is coupled to the voltage source VDD terminal. The positive terminal of the diode 1004 in the diode series 506 is coupled to the bonding pad 504. A diode 1006 and another diode 1008 connect serially to form the diode series 508. The negative terminal of the diode 1006 in the diode series 508 is coupled to the positive terminal of the diode 1004. The positive terminal of the diode 1008 in the diode series 508 is coupled to the voltage source VSS terminal. A Zener diode 1010 serves as the control circuit 510. The Zener diode 1010 in the control circuit 510 is coupled between the positive terminal of the diode 1002 and the triggering terminal of the SCR 512. A Zener diode 1012 serving as the control circuit 518 is coupled between the positive terminal of the diode 1006 and the triggering terminal of the SCR 520.

When the integrated circuit (not shown) is operating normally, the sum of the voltage drop across the diode series 506 and the operating voltage VDD is greater than the potential at the bonding pad 504. Hence, the diode series 506 remains non-conductive. The negative terminal of the diode series 508 has a voltage identical to the bonding pad 504 and the positive terminal of the diode series 508 is at zero volts. The diode series 508 is in reverse biased and hence the diode series 508 remains non-conductive. Since the triggering terminal of the SCR 512 receives no triggering current, the triggered voltage of the SCR 512 is higher than the operating voltage VDD and the SCR 512 remains non-conductive. Thus, no leakage current flows in the SCR 512. The triggering terminal of the SCR 520 also receives no triggering current. Hence, the triggered voltage of the SCR 520 is higher than the operating voltage VDD and the SCR 520 remains non-conductive. Again, no leakage current flows in the SCR 520. In brief, the SCR 512 and 520 for bypassing ESD current will not affect normal operation of the integrated circuit (not shown). Furthermore, the larger the number of diodes in the diode series (such as the diode series 506 and 508), the smaller will be the equivalent capacitance of all serially connected diodes. With the equivalent input capacitance seen from the bonding pad 504 greatly reduced, the ESD protection circuit can be applied to high frequency or radio frequency circuits.

When an electrostatic discharge between the bonding pad or output pad with respect to the voltage sources VDD and VSS occurs, actions induced in the ESD protection circuit depends on the operating mode. Possible modes of operation for the ESD circuit in FIG. 10 include a PS mode, an NS mode, a PD mode, an ND mode and a voltage source VDD terminal/voltage source VSS terminal mode.

In the PS mode, a positive voltage pulse appears at the bonding pad 504. Since the ESD voltage is greater than the voltage drop along the circuit path for diode 1004-Zener diode 1010-$P^+/P^-/N^+$ of the SCR 512-diode DAa 516 to diode Dna 1014, all the diode 1004, the Zener diode 1010, the $P^+/P^-/N^+$ of the SCR 512 and the diode DAa 516 to the diode Dna 1014 along the circuit conduct. Hence, the triggering terminal of the SCR 512 receives a triggering current so that the triggered voltage of the SCR 512 drops. In addition, because the ESD voltage is greater than all the voltage drops along the circuit path diode 1004-diode 1002-diode series 514-SCR 512, the diode 1004, the diode 1002, the diode series 514 and the SCR 512 all are turned on. The ESD current flows into two routes. One route goes through diode 1004-Zener diode 1010-P/$P^-$/N of SCR 512-diode DAa 516 to diode 1014. The other route goes through the diode 1004, the diode 1002, the diode series 514, and the SCR 512. Thus damage on the internal circuit 502 is surely avoided. After dumping the ESD current via the diode 1004, the diode 1002, the diode series 514 and the SCR 512, the SCR 512 is immediately shut because the holding voltage of the SCR 512 together with the voltage drop across the diode series 514 is now greater than the operating voltage VDD.

In the NS mode, a negative voltage pulse appears at the bonding pad 504. Since the positive terminal of the diode series 508 is at zero volts and the negative terminal of the diode series 508 receives the negative pulse voltage, the diode series 508 is under forward biased. Hence, the negative voltage pulse is discharged through the diode series 508 and damages to the internal circuit 502 due to ESD are prevented.

In the PD mode, a positive voltage pulse appears at the bonding pad 504. Since the negative terminal of the diode series 506 is at zero voltage (voltage at the voltage terminal VDD can be regarded as zero during ESD transient) and the positive terminal of the diode series 506 receives the positive voltage pulse, the diode series 506 is under forward biased. Hence, the positive voltage pulse is discharged through the diode series 506 and damages to the internal circuit 502 due to ESD are greatly minimized.

In the ND mode, a negative voltage pulse appears at the bonding pad 504. Since the ESD voltage is greater than the voltage drop along the circuit path for diode 1006-Zener diode 1012-$N^+/N^-/P^+$ of the SCR 520-diode Dnb 1016 (the voltage drop of three diodes and one Zener diode in reverse biased), the diode 1006, the Zener diode 1012, the $N^+/N^-/P^+$ of the SCR 520 and the diode Dnb 1016 along the circuit all are turned on. Hence, the triggering terminal of the SCR 520 receives a triggering current so that the triggered voltage of the SCR 520 drops. In addition, because the ESD voltage is greater than all the voltage drops along the circuit path diode 1006-diode 1008-diode series 522-SCR 520, the diode 1006, the diode 1008, the diode series 522 and the SCR 520 all are turned on. Hence, the ESD current discharges through the diode 1006, the diode 1008, the diode series 522 and the SCR 520 without causing any damage to the internal circuit 502. After dumping the ESD current via the diode 1006, the diode 1008, the diode series 522 and the SCR 520, the SCR 520 is immediately shut because the holding voltage of the SCR 520 together with the voltage drop across the diode series 522 is now greater than the operating voltage VDD.

In the voltage source VDD terminal/voltage source VSS terminal mode, a positive voltage pulse appears at the voltage source VDD terminal. Since the ESD voltage is greater than the voltage drop along the circuit path for diode Dnb 1016 to diode DBb 524-$P^+/N^-/N^+$ of the SCR 520-Zener diode 1012-diode 1006-diode 1004-Zener diode 1010-$P^+/P^-/N^+$ of the SCR 512-diode DAa 516 to diode Dna 1014, all the diode 1016 to diode DBb 524, the $P^+/N^-/N^+$ of the SCR 520, the Zener diode 1012, the diode Dnb 1006, the diode 1004, the Zener diode 1010, the $P^+/P^-/N^+$ of the SCR 512 and the diode DAa 516 to the diode Dna 1014 conduct. Hence, the triggering terminal of the SCR 512 receives a triggering current so that the triggered voltage of the SCR 512 drops. In addition, because the ESD voltage is greater than the voltage drop across the SCR 512 and the diode series 514, the SCR 512 and the diode series 514 conduct. Hence, ESD current is discharged through the SCR 512 and the diode series 514 and possible damages to the internal circuit 502 are minimized. After dumping the ESD current via the SCR 512 and the diode series 514, the SCR 512 is immediately shut because the holding voltage of the SCR 512 together with the voltage drop across the diode series 514 is now greater than the operating voltage VDD.

Figure 11:
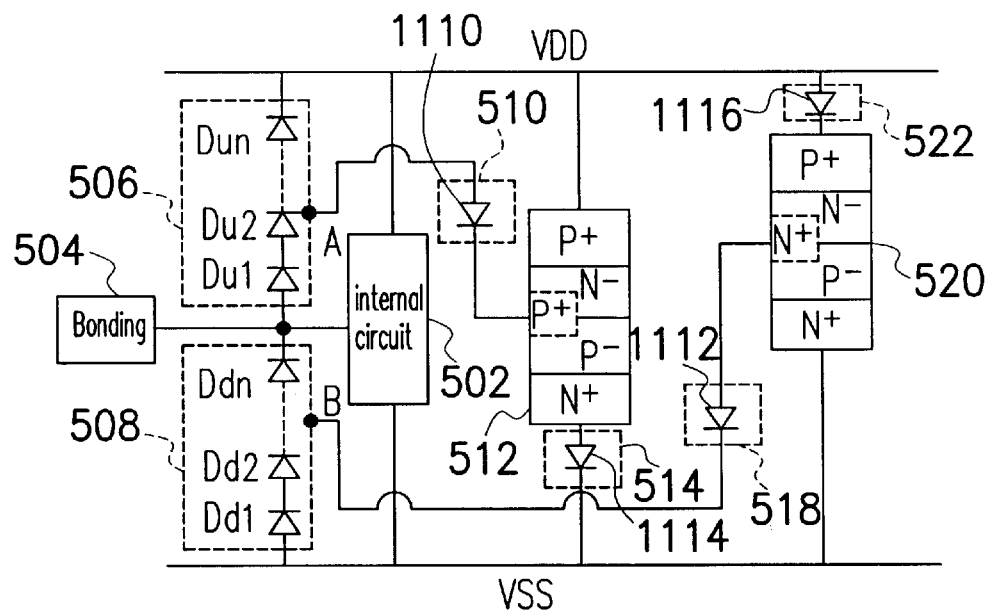
FIG. 11 is a circuit diagram showing a sixth application of the ESD protection circuit shown in FIG. 5.

FIG. 11 is a circuit diagram showing a sixth application of the ESD protection circuit shown in FIG. 5. As shown in FIG. 11, a diode 1110 serving as the control circuit 510 is coupled to the positive terminal of one of the diodes (not shown) in the diode series 506 and the triggering terminal of the SCR 512 respectively. Another diode 1112 serving as the control circuit 518 is coupled to the positive terminal of one of the diodes (not shown) of the diode series 508 and the triggering terminal of the SCR 520 respectively. A diode 1114 constitutes the diode series 514. The negative terminal of the diode 1114 is coupled to the voltage source VSS terminal so that the anode node of the SCR 512 is coupled to the voltage source VDD terminal and the cathode node of the SCR 512 is coupled to the positive terminal of the diode 1114. Similarly, a diode 1116 constitutes the diode series 522. The positive terminal of the diode 1116 is coupled to the voltage source VDD terminal so that the anode node of the SCR 520 is coupled to the negative terminal of the diode 1116 and the cathode node of the SCR 512 is coupled to the voltage source VSS terminal.

When the integrated circuit (not shown) is operating normally, the positive terminal and the negative terminal of the diode series 506 are at the same potential. Hence, the diode series 506 remains non-conductive. The negative terminal of the diode series 508 is at the same voltage as the bonding pad 504 and the positive terminal of the diode series 508 is at zero volts. The second diode series 508 is in reverse biased and hence the diode series 508 remains non-conductive. Since the triggering terminal of the SCR 512 receives no triggering current, the triggered voltage of the SCR 512 is higher than the operating voltage VDD and the SCR 512 remains non-conductive. Thus, no leakage current flows in the SCR 512. The triggering terminal of the SCR 520 also receives no triggering current. Hence, the triggered voltage of the SCR 520 is higher than the operating voltage VDD and the SCR 520 remains non-conductive. Again, no leakage current flows in the SCR 520. In brief, the SCR 512 and 520 for bypassing ESD current will not affect normal operation of the integrated circuit (not shown). Furthermore, the larger the number of diodes in the diode series (such as the diode series 506 and 508), the smaller will be the equivalent capacitance of all serially connected diodes. With the equivalent input capacitance seen from the bonding pad 504 greatly reduced, the ESD protection circuit can be applied to high frequency or radio frequency circuits.

When an electrostatic discharge between the bonding pad or output pad with respect to the voltage sources VDD and VSS occurs, actions induced in the ESD protection circuit depends on the operating mode. Possible modes of operation for the ESD circuit in FIG. 11 include a PS mode, an NS mode, a PD mode, an ND mode and a voltage source VDD terminal/voltage source VSS terminal mode.

In the PS mode, a positive voltage pulse appears at the bonding pad 504. Since the ESD voltage is greater than the voltage drop along the circuit path for portions of the diodes (not shown) in diode series 506-diode 1110-$P^+/P^-/N^+$ of the SCR 512-diode 1114, the portion of the diodes (not shown) in the diode series 506, diode 1110, the $P^+/P^-/N^+$ of the SCR 512 and the diode 1114 along the circuit all are turned on. Hence, the triggering terminal of the SCR 512 receives a triggering current so that the triggered voltage of the SCR 512 drops. In addition, because the ESD voltage is greater than all the voltage drops along the circuit path for diode series 506-SCR 512-diode 1114, the diode series 506, the SCR 512 and the diode 1114 all are turned on. The ESD current flows into two routes. One route goes through some diodes (not shown) in the diode series 506-diode 1110-$P/P^-/N$ of SCR 512-diode 1114. The other route goes through the diode series 506, the SCR 512 and the diode 1114. Thus, damage on the internal circuit 502 is surely avoided. After dumping the ESD current via the diode series 506, the SCR 512 and the diode 1114, the SCR 512 is immediately shut because the holding voltage of the SCR 512 together with the voltage drop across the diode 1114 is now greater than the operating voltage VDD.

In the NS mode, a negative voltage pulse appears at the bonding pad 504. Since the positive terminal of the diode series 508 is at zero volts and the negative terminal of the diode series 508 receives the negative pulse voltage, the diode series 508 is under forward biased. Hence, the negative voltage pulse is discharged through the diode series 508 and damages to the internal circuit 502 due to ESD are prevented.

In the PD mode, a positive voltage pulse appears at the bonding pad 504. Since the negative terminal of the diode series 506 is at zero voltage (voltage at the voltage terminal VDD can be regarded as zero during ESD transient) and the positive terminal of the diode series 506 receives the positive voltage pulse, the diode series 506 is under forward biased. Hence, the positive voltage pulse is discharged through the diode series 506 and damages to the internal circuit 502 due to ESD are greatly minimized.

In the ND mode, a negative voltage pulse appears at the bonding pad 504. Since the ESD voltage is greater than the voltage drop along the circuit path for a portion of the diodes (not shown) in diode series 508-diode 1112-$N^+/N^-/P^+$ of the SCR 520-diode 1116. the portion of the diodes (not shown) in the diode series 508, the diode 1112, the $N^+/N^-/P^+$ of the SCR 520 and the diode 1116 along the circuit all are turned on. Hence, the triggering terminal of the SCR 520 receives a triggering current so that the triggered voltage of the SCR 520 drops. In addition, because the ESD voltage is greater than all the voltage drops along the circuit path for diode series 508-SCR 520-diode 1116, the diode series 508, the SCR 520 and the diode 1116 all are turned on. The ESD current flows into two routes. One route goes through some diodes (not shown) in the diode series 508-diode 1112-$N/N^-/P$ of SCR 520-diode 1116. The other route goes through the diode series 508, the SCR 520 and the diode 1116. Thus, damage on the internal circuit 502 is surely avoided. After dumping the ESD current via the diode series 508, the SCR 520 and the diode 1116, the SCR 520 is immediately shut because the holding voltage of the SCR 520 together with the voltage drop across the diode 1116 is now greater than the operating voltage VDD.

In the voltage source VDD terminal/voltage source VSS terminal mode, a positive voltage pulse appears at the voltage source VDD terminal. Since the ESD voltage is greater than the voltage drop along the circuit path for diode 1116-$P^+/N^-/N^+$ of the SCR 520-diode 1112-portion of diodes (not shown) in diode series 508-portion of the diodes (not shown) in diode series 506-diode 1110-$P^+/P^-/N^+$ of the SCR 512-diode 1114, the diode 1116, the $P^+/N^-/N^+$ of the SCR 520, the diode 1112, the portion of diodes (not shown) in diode series 508, the portion of diodes (not shown) in diode series 506, the diode 1110, the $P^+/P^-/N^+$ of the SCR 512 and the diode 1114 all are turned on. Hence, the triggering terminal of the SCR 512 receives a triggering current so that the triggered voltage of the SCR 512 drops. In addition, because the ESD voltage is greater than the voltage drop across the SCR 512 and the diode 1114 (the voltage drop of one diode and the triggered voltage of a SCR), the SCR 512 and the diode 1114 conduct. Hence, ESD current is released through the SCR 512 and the diode 1114 and possible damages to the internal circuit 502 are minimized. After dumping the ESD current via the SCR 512 and the diode 1114, the SCR 512 is immediately shut because the holding voltage of the SCR 512 together with the voltage drop across the diode 1114 is now greater than the operating voltage VDD.

Figure 12:
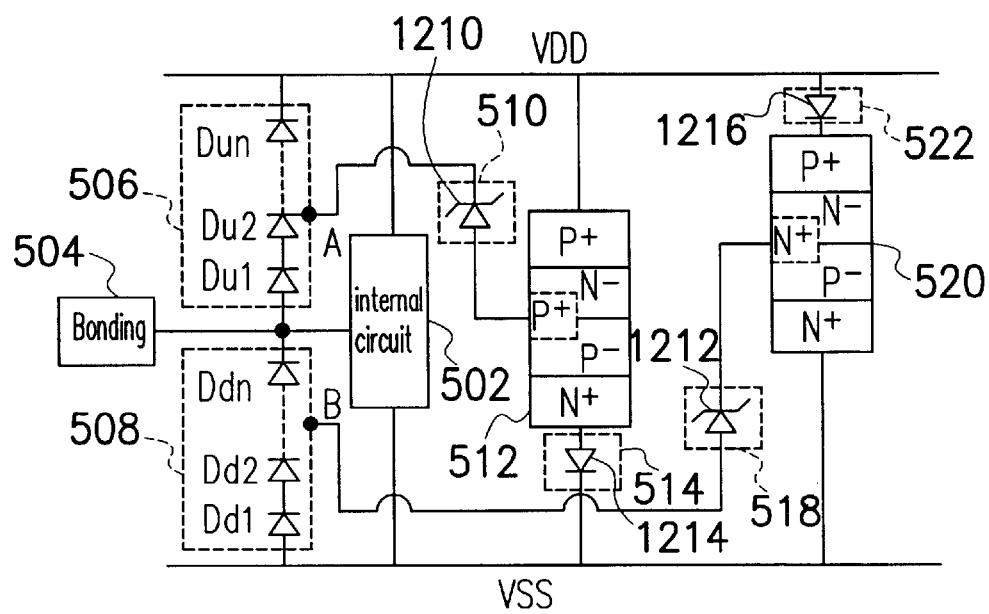
FIG. 12 is a circuit diagram showing a seventh application of the ESD protection circuit shown in FIG. 5.

FIG. 12 is a circuit diagram showing a seventh application of the ESD protection circuit shown in FIG. 5. As shown in FIG. 12, a Zener diode 1210 serving as the control circuit 510 is coupled to the positive terminal of one of the diodes (not shown) in the diode series 506 and the triggering terminal of the SCR 512 respectively. Another Zener diode 1212 serving as the control circuit 518 is coupled to the positive terminal of one of the diodes (not shown) of the diode series 508 and the triggering terminal of the SCR 520 respectively. A diode 1214 constitutes the diode series 514. The negative terminal of the diode 1214 is coupled to the voltage source VSS terminal so that the anode node of the SCR 512 is coupled to the voltage source VDD terminal and the cathode node of the SCR 512 is coupled to the positive terminal of the diode 1214. Similarly, a diode 1216 constitutes the diode series 522. The positive terminal of the diode 1216 is coupled to the voltage source VDD terminal so that the anode node of the SCR 520 is coupled to the negative terminal of the diode 1216 and the cathode node of the SCR 512 is coupled to the voltage source VSS terminal.

When the integrated circuit (not shown) is operating normally, the positive terminal and the negative terminal of the diode series 506 are at the same potential. Hence, the diode series 506 remains non-conductive. The negative terminal of the diode series 508 is at the same voltage as the bonding pad 504 and the positive terminal of the diode series 508 is at zero volts. The second diode series 508 is in reverse biased and hence the diode series 508 remains non-conductive. Since the triggering terminal of the SCR 512 receives no triggering current, the triggered voltage of the SCR 512 is higher than the operating voltage VDD and the SCR 512 remains non-conductive. Thus, no leakage current flows in the SCR 512. The triggering terminal of the SCR 520 also receives no triggering current. Hence, the triggered voltage of the SCR 520 is higher than the operating voltage VDD and the SCR 520 remains non-conductive. Again, no leakage current flows in the SCR 520. In brief, the SCR 512 and 520 for bypassing ESD current will not affect normal operation of the integrated circuit (not shown). Furthermore, the larger the number of diodes in the diode series (such as the diode series 506 and 508), the smaller will be the equivalent capacitance of all serially connected diodes. With the equivalent input capacitance seen from the bonding pad 504 greatly reduced, the ESD protection circuit can be applied to high frequency or radio frequency circuits.

When an electrostatic discharge between the bonding pad or output pad with respect to the voltage sources VDD and VSS occurs, actions induced in the ESD protection circuit depends on the operating mode. Possible modes of operation for the BSD circuit in FIG. 12 include a PS mode, an NS mode, a PD mode, an ND mode and a voltage source VDD terminal/voltage source VSS terminal mode.

In the PS mode, a positive voltage pulse appears at the bonding pad 504. Since the ESD voltage is greater than the voltage drop along the circuit path for portions of the diodes (not shown) in diode series 506-Zener diode 1210-$P^+/P^-/N^+$ of the SCR 512-diode 1214, the portion of the diodes (not shown) in the diode series 506, the Zener diode 1210, the $P^+/P^-/N^+$ of the SCR 512 and the diode 1214 along the circuit all are turned on. Hence, the triggering terminal of the SCR 512 receives a triggering current so that the triggered voltage of the SCR 512 drops. In addition, because the ESD voltage is greater than all the voltage drops along the circuit path diode series 506-SCR 512-diode 1214, the diode series 506, the SCR 512 and the diode 1214 all are turned on. The ESD current flows into two routes. One route goes through some diodes in the diode series 506-Zener diode 1210-$P/P^-/N$ of SCR 512-diode 1214. The other route goes through the diode series 506, the SCR 512 and the diode 1214. Thus, damage on the internal circuit 502 is surely avoided. After dumping the ESD current via the diode series 506, the SCR 512 and the diode 1214, the SCR 512 is immediately shut because the holding voltage of the SCR 512 together with the voltage drop across the diode 1214 is now greater than the operating voltage VDD.

In the NS mode, a negative voltage pulse appears at the bonding pad 504. Since the positive terminal of the diode series 508 is at zero volts and the negative terminal of the diode series 508 receives the negative pulse voltage, the diode series 508 is under forward biased. Hence, the negative voltage pulse is discharged through the diode series 508 and damages to the internal circuit 502 due to ESD are prevented.

In the PD mode, a positive voltage pulse appears at the bonding pad 504. Since the negative terminal of the diode series 506 is at zero volts (voltage at the voltage terminal VDD can be regarded as zero during ESD transient) and the positive terminal of the diode series 506 receives the positive voltage pulse, the diode series 506 is under forward biased. Hence, the positive voltage pulse is discharged through the diode series 506 and damages to the internal circuit 502 due to ESD are greatly minimized.

In the ND mode, a negative voltage pulse appears at the bonding pad 504. Since the ESD voltage is greater than the voltage drop along the circuit path for a portion of the diodes (not shown) in diode series 508-Zener diode 1212-$N^+/N^-/P^+$ of the SCR 520-diode 1216, the portion of the diodes (not shown) in the diode series 508, the Zener diode 1212, the $N^+/N^-/P^+$ of the SCR 520 and the diode 1216 along the circuit all are turned on. Hence, the triggering terminal of the SCR 520 receives a triggering current so that the triggered voltage of the SCR 520 drops. In addition, because the ESD voltage is greater than all the voltage drops along the circuit path diode series 508-SCR 520-diode 1216, the diode series 508, the SCR 520 and the diode 1216 all are turned on. The ESD current flows into two routes. One route goes through some diodes in the diode series 508-Zener diode 1212-N/$N^-$/P of SCR 520-diode 1216. The other route goes through the diode series 508, the SCR 520 and the diode 1216. Thus, damage on the internal circuit 502 is surely avoided. After dumping the ESD current via the diode series 508, the SCR 520 and the diode 1216, the SCR 520 is immediately shut because the holding voltage of the SCR 520 together with the voltage drop across the diode 1216 is now greater than the operating voltage VDD.

In the voltage source VDD terminal/voltage source VSS terminal mode, a positive voltage pulse appears at the voltage source VDD terminal. Since the ESD voltage is greater than the voltage drop along the circuit path for diode 1216-$P^+/N^-/N$ $^+$ of the SCR 520-Zener diode 1212-portion of diodes (not shown) in diode series 508-portion of the diodes (not shown) in diode series 506-Zener diode 1210-$P^+/P^-/N^+$ of the SCR 512-diode 1214, the diode 1216, the $P^+/N^-/N^+$ of the SCR 520, the Zener diode 1212, the portion of diodes (not shown) in diode series 508, the portion of diodes (not shown) in diode series 506, the Zener diode 1210, the $P^+/P^-/N^+$ of the SCR 512 and the diode 1214 all are turned on. Hence, the triggering terminal of the SCR 512 receives a triggering current so that the triggered voltage of the SCR 512 drops. In addition, because the ESD voltage is greater than the voltage drops across the SCR 512 and the diode 1214 (the voltage drop of one diode and the triggered voltage of a SCR), the SCR 512 and the diode 1214 conduct. Hence, ESD current is released through the SCR 512 and the diode 1214 and possible damages to the internal circuit 502 are minimized. After dumping the ESD current via the SCR 512 and the diode 1214, the SCR 512 is immediately shut because the holding voltage of the SCR 512 together with the voltage drop across the diode 1214 is now greater than the operating voltage VDD.

Figure 13:
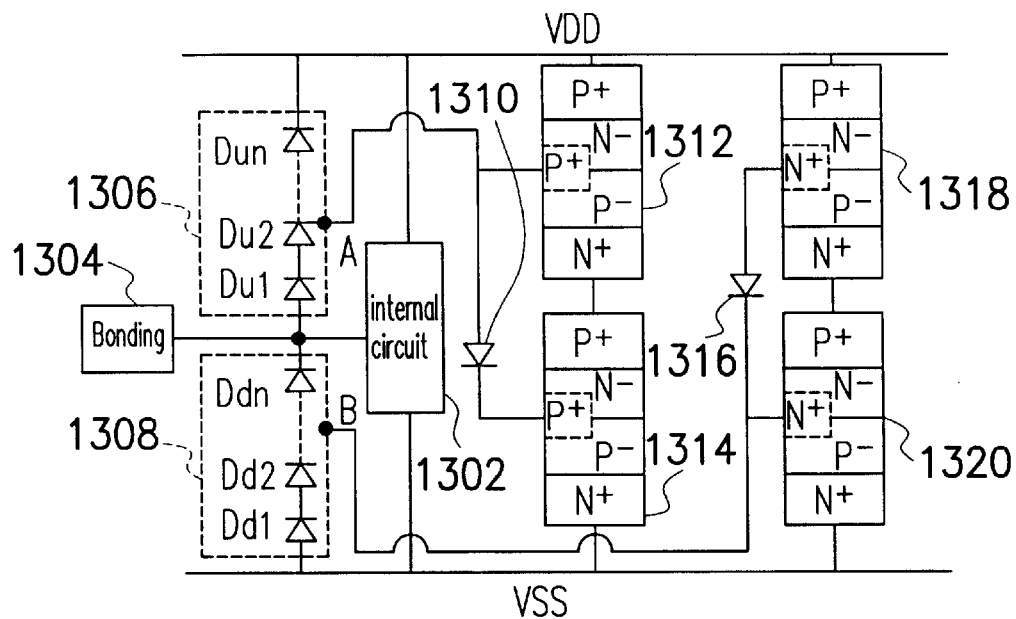
FIG. 13 is a diagram showing a low capacitance ESD protection circuit for a built-in CMOS chip according to a second preferred embodiment of this invention.

FIG. 13 is a diagram showing a low capacitance ESD protection circuit for a built-in CMOS chip according to a second preferred embodiment of this invention. As shown in FIG. 13, the ESD protection circuit protects an internal circuit 1302 within a silicon chip (not shown). The ESD protection circuit is coupled to a bonding pad 1304 and the internal circuit 1302.

The ESD protection circuit includes a first diode series 1306, a second diode series 1308, a first diode 1310, a first silicon-controlled rectifier (SCR) 1312, a second silicon-controlled rectifier (SCR) 1314, a second diode 1316, a third silicon-controlled rectifier 1328 and a fourth silicon-controlled rectifier 1320. The diode series 1306 comprises of n serially connected diodes (indicated by Du1, Du2, . . . , Dun in FIG. 13). The negative terminal of the diode series 1306 is coupled to a voltage source VDD terminal and the positive terminal of the diode series 1306 is coupled to the bonding pad 1304. The diode series 1308 comprises of n serially connected diodes (indicated by Dd1, Dd2, . . . , Ddn in FIG. 13). The negative terminal of the diode series 1308 is coupled to the positive terminal of the diode series 1306 and the positive terminal of the diode series 1308 is coupled to a voltage source VSS terminal. The positive terminal of the diode 1310 is coupled to the positive terminal of one of the diodes (not shown) of the diode series 1306 and the triggering terminal of the SCR 1312. The negative terminal of the diode 1310 is coupled to the triggering terminal of the SCR 1314. The anode node of the SCR 1312 is coupled to the voltage source VDD terminal and the cathode node of the SCR 1312 is coupled to the anode node of the SCR 1314. The cathode node of the SCR 1314 is coupled to a voltage source VSS terminal. The negative terminal of the diode 1316 is coupled to one of the diodes (not shown) of the diode series 1308 and the triggering terminal of the SCR 1320. The positive terminal of the diode 1316 is coupled to the triggering terminal of the SCR 1318. The anode node of the SCR 1318 is coupled to the voltage source VDD terminal and the cathode node of the SCR 1318 is coupled to the anode node of the SCR 1320. The cathode node of the SCR 1320 is coupled to a voltage source VSS terminal.

The silicon-controlled rectifiers (SCRs) 1312 and 1314 include four doped layers $P^+$-$N^-$-$P^-$-$N^+$ from the anode node to the cathode node and an additional $P^+$ layer is also formed between the $N^-$-$P^-$ layers. The $P^+$ layer is the triggering terminal of the SCRs 1312 and 1314. Similarly, the silicon-controlled rectifiers (SCRs) 1318 and 1320 include four doped layers $P^+$-$N^-$-$P^-$-$N^+$ from the anode node to the cathode node and an additional $N^+$ layer is also formed between the $N^-$-$P^-$ layers. The $N^+$ layer is the triggering terminal of the SCRs 1318 and 1320.

When the integrated circuit (not shown) is operating normally, the positive terminal and the negative terminal of the diode series 1306 are at the same potential. Hence, the diode series 1306 remains non-conductive. The negative terminal of the diode series 1308 is at the same voltage as the bonding pad 1304 and the positive terminal of the diode series 1308 is at zero volts. The diode series 1308 is in reverse biased and hence the diode series 1308 remains non-conductive. Since the triggering terminal of the SCRs 1312 and 1314 receive no triggering current, the triggered voltage of the SCRs 1312 and 1314 is higher than the operating voltage VDD. The SCRs 1312 and 1314 remain non-conductive. Thus, no leakage current flows in the SCRs 1312 and 1314. The triggering terminal of the SCRs 1318 and 1320 also receive no triggering current. Hence, the triggered voltage of the SCRs 1318 and 1320 is higher than the operating voltage VDD. The SCRs 1318 and 1320 remain non-conductive. Again, no leakage current flows in the SCRs 1318 and 1320. In brief, the SCRs 1312, 1314, 1318 and 1320 for bypassing ESD current will not affect normal operation of the integrated circuit (not shown). Furthermore, the larger the number of diodes in the diode series (such as the diode series 1306 and 1308), the smaller will be the equivalent capacitance of all serially connected diodes. With the equivalent input capacitance seen from the bonding pad 1304 greatly reduced, the ESD protection circuit can be applied to high frequency or radio frequency circuits.

When an electrostatic discharge between the bonding pad or output pad with respect to the voltage sources VDD and VSS occurs, actions induced in the ESD protection circuit depends on the operating mode. Possible modes of operation for the ESD circuit in FIG. 13 include a PS mode (a positive voltage pulse is applied to the bonding pad 1304 and the voltage source VSS terminal is connected to ground), an NS mode (a negative voltage pulse is applied to the bonding pad 1304 and the voltage source VSS terminal is connected to ground), a PD mode (a positive voltage pulse is applied to the bonding pad 1304 and the voltage source VDD terminal is connected to ground), an ND mode (a negative pulse voltage is applied to the bonding pad 1304 and the voltage source VDD terminal is connected to ground) and a voltage source VDD terminal/voltage source VSS terminal mode.

In the PS mode, a positive voltage pulse relative to the voltage source VSS appears at the bonding pad 1304. Since the ESD voltage is greater than the voltage drop along the circuit path for portions of the diodes (not shown) in diode series 1306-diode 1310-$P^+/P^-/N^+$ of the SCR 1314, the portion of the diodes (not shown) in the diode series 1306, the diode 1310 and the $P^+/P^-/N^+$ of the SCR 1314 along the circuit all are turned on. Hence, the triggering terminal of the SCRs 1312 and 1314 receive a triggering current so that the triggered voltage of the SCRs 1312 and 1314 drop. In addition, because the ESD voltage is greater than all the voltage drops along the circuit path for diode series 1306-SCR 1312-SCR 1314, the diode series 1306, the SCR 1312 and the SCR 1314 all are turned on. The ESD current flows into two routes. One route goes through some diodes (not shown) in the diode series 1306-diode 1310-$P/P^-/N$ of SCR 1314. The other route goes through the diode series 1306, the SCR 1312 and SCR 1314. Thus, damage on the internal circuit 1302 is surely avoided. After dumping the ESD current via the diode series 1306, the SCR 1312 and the SCR 1314, the SCRs 1312 and SCR 1314 are immediately shut because the holding voltage of the SCRs 1312 and the SCR 1314 together is now greater than the operating voltage VDD.

In the NS mode, a negative voltage pulse relative to the voltage source VSS appears at the bonding pad 1304. Since the positive terminal of the diode series 1308 is at zero volt and the negative terminal of the diode series 1308 receives the negative pulse voltage, the diode series 1308 is under forward biased. Hence, the negative voltage pulse is discharged through the diode series 1308 and damages to the internal circuit 1302 due to ESD are prevented.

In the PD mode, a positive voltage pulse relative to the voltage source VDD appears at the bonding pad 1304. Since the negative terminal of the diode series 1306 is at zero voltage (voltage at the voltage terminal VDD can be regarded as zero during ESD transient) and the positive terminal of the diode series 1306 receives the positive voltage pulse, the diode series 1306 is under forward biased. Hence, the positive voltage pulse is discharged through the diode series 1306 and damages to the internal circuit 1302 due to ESD are greatly minimized.

In the ND mode, a negative voltage pulse relative the voltage VDD appears at the bonding pad 1304. Since the ESD voltage is greater than the voltage drop along the circuit path for a portion of the diodes (not shown) in diode series 1308-diode 1316-$N^+/N^-/P^+$ of the SCR 1318, the portion of the diodes (not shown) in the diode series 1308, the diode 1316 and the $N^+/N^-/P^+$ of the SCR 1318 along the circuit all are turned on. Hence, the triggering terminal of the SCRs 1318 and the SCR 1320 receive a triggering current so that the triggered voltage of the SCRs 1318 and SCR 1320 drop. In addition, because the ESD voltage is greater than all the voltage drops along the circuit path for diode series 1308-SCR 1320-SCR 1318, the diode series 1308, the SCR 1320 and the SCR 1318 all are turned on. The ESD current flows into two routes. One route goes through some diodes (not shown) in the diode series 1308-diode 1316-N/N⁻/P of SCR 1318. The other route goes through the diode series 1308, the SCR 1320 and the SCR 1318. Thus, damage on the internal circuit 1302 is surely avoided. After dumping the ESD current via the diode series 1308, the SCR 1320 and the SCR 1318, the SCR 1318 and the SCR 1320 are immediately shut because the holding voltage of the SCR 1318 and the SCR 1320 together is now greater than the operating voltage VDD.

In the voltage source VDD terminal/voltage source VSS terminal mode, a positive voltage pulse appears at the voltage source VDD terminal. Since the ESD voltage is greater than the voltage drop along the circuit path for $P^+/N^-/N^+$ of the SCR 1318-diode 1316-portion of diodes (not shown) in diode series 1308-portion of the diodes (not shown) in diode series 1306-diode 1310-$P^+/P^-/N^+$ of the SCR 1314, the $P^+/N^-/N^+$ of the SCR 1318, the diode 1316, the portion of diodes (not shown) in diode series 1308, the portion of diodes (not shown) in diode series 1306, the diode 1310 and the $P^+/P^-/N^+$ of the SCR 1314 all are turned on. Hence, the triggering terminal of the SCR 1312 and the SCR 1314 receive a triggering current so that the triggered voltage of the SCR 1312 and SCR 1314 drop. In addition, because the ESD voltage is greater than the voltage drop across the SCRs 1312 and 1314 (the triggered voltage of two SCRs), the SCR 1312 and the SCR 1314 conduct. Hence, ESD current is released through the SCRs 1312 and 1314 and possible damages to the internal circuit 1302 are minimized. After dumping the ESD current via the SCRs 1312 and 1314, the SCRs 1312 and 1314 are immediately shut because the holding voltage of the SCRs 1312 and 1314 together is now greater than the operating voltage VDD.

Figure 14:
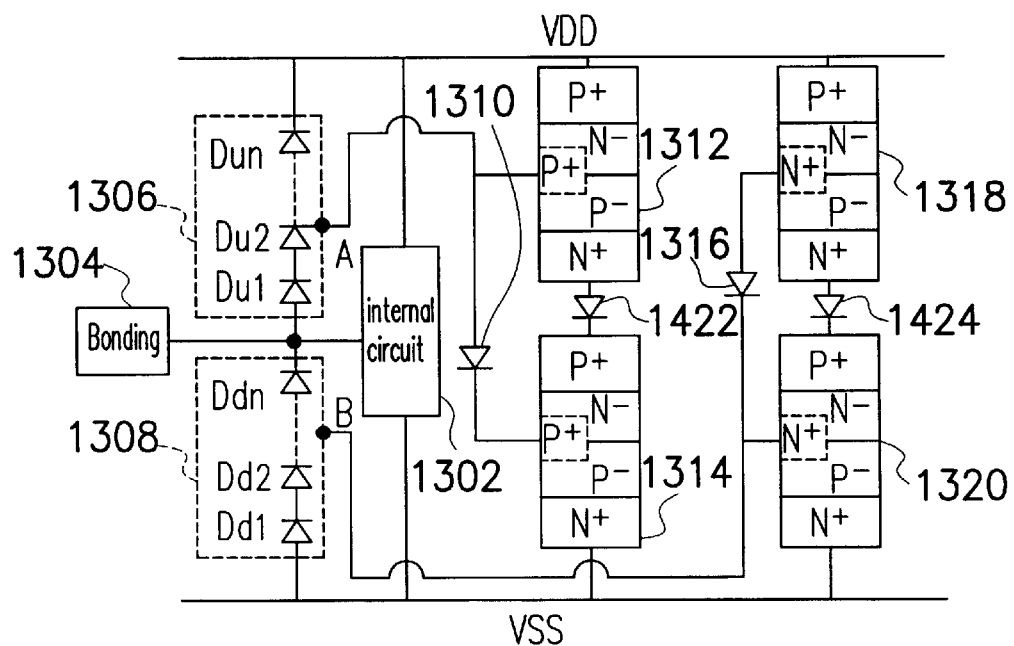
FIG. 14 is a circuit diagram showing an application of the ESD protection circuit shown in FIG. 13.

FIG. 14 is a circuit diagram showing an application of the ESD protection circuit shown in FIG. 13. In FIG. 14, the positive terminal of a diode 1422 is coupled to the cathode node of the SCR 1312 and the negative terminal of the diode 1422 is coupled to the anode node of the SCR 1314. Similarly, the positive terminal of a diode 1424 is coupled to the cathode node of the SCR 1318 and the negative terminal of the diode 1424 is coupled to the anode node of the SCR 1320.

When the integrated circuit (not shown) is operating normally, the positive terminal and the negative terminal of the diode series 1306 are at the same potential. Hence, the diode series 1306 remains non-conductive. The negative terminal of the diode series 1308 is at the same voltage as the bonding pad 1304 and the positive terminal of the diode series 1308 is at zero volts. The diode series 1308 is in reverse biased and hence the diode series 1308 remains non-conductive. Since the triggering terminal of the SCRs 1312 and 1314 receive no triggering current, the triggered voltage of the SCRs 1312 and 1314 is higher than the operating voltage VDD. The SCRs 1312 and 1314 remain non-conductive. Thus, no leakage current flows in the SCRs 1312 and 1314. The triggering terminal of the SCRs 1318 and 1320 also receive no triggering current. Hence, the triggered voltage of the SCRs 1318 and 1320 is higher than the operating voltage VDD. The SCRs 1318 and 1320 remain non-conductive. Again, no leakage current flows in the SCRs 1318 and 1320. In brief, the SCRs 1312, 1314, 1318 and 1320 for bypassing ESD current will not affect normal operation of the integrated circuit (not shown). Furthermore, the larger the number of diodes in the diode series (such as the diode series 1306 and 1308), the smaller will be the equivalent capacitance of all serially connected diodes. With the equivalent input capacitance seen from the bonding pad 1304 greatly reduced, the ESD protection circuit can be applied to high frequency or radio frequency circuits.

When an electrostatic discharge between the bonding pad or output pad with respect to the voltage sources VDD and VSS occurs, actions induced in the ESD protection circuit depends on the operating mode. Possible modes of operation for the ESD circuit in FIG. 14 include a PS mode, an NS mode, a PD mode, an ND mode and a voltage source VDD terminal/voltage source VSS terminal mode.

In the PS mode, a positive voltage pulse appears at the bonding pad 1304. Since the ESD voltage is greater than the voltage drop along the circuit path for portions of the diodes (not shown) in diode series 1306-diode 1310-$P^+/P^-/N^+$ of the SCR 1314, the portion of the diodes (not shown) in the diode series 1306, the diode 1310 and the $P^+/P^-/N^+$ of the SCR 1314 along the circuit all are turned on. Hence, the triggering terminal of the SCRs 1312 and 1314 receive a triggering current so that the triggered voltage of the SCRs 1312 and 1314 drop. In addition, because the ESD voltage is greater than all the voltage drops along the circuit path for diode series 1306-SCR 1312-diode 1422-SCR 1314, the diode series 1306, the SCR 1312, the diode 1422 and the SCR 1314 all are turned on. The ESD current flows into two routes. One route goes through some diodes (not shown) in the diode series 1306-diode 1310-$P^+/P^-/N^+$ of SCR 1314. The other route goes through the diode series 1306, the SCR 1312, the diode 1422, and the SCR 1314. Thus, damage on the internal circuit 1302 is surely avoided. After dumping the ESD current via the diode series 1306, the SCR 1312, the diode 1422 and the SCR 1314, the SCRs 1312 and SCR 1314 are immediately shut because the holding voltage of the SCRs 1312 and the SCR 1314 together with the voltage drop of the diode 1422 is now greater than the operating voltage VDD.

In the NS mode, a negative voltage pulse appears at the bonding pad 1304. Since the positive terminal of the diode series 1308 is at zero volt and the negative terminal of the diode series 1308 receives the negative pulse voltage, the diode series 1308 is under forward biased. Hence, the negative voltage pulse is discharged through the diode series 1308 and damages to the internal circuit 1302 due to ESD are prevented.

In the PD mode, a positive voltage pulse appears at the bonding pad 1304. Since the negative terminal of the diode series 1306 is at zero voltage (voltage at the voltage terminal VDD can be regarded as zero during ESD transient) and the positive terminal of the diode series 1306 receives the positive voltage pulse, the diode series 1306 is under forward biased. Hence, the positive voltage pulse is discharged through the diode series 1306 and damages to the internal circuit 1302 due to ESD are greatly minimized.

In the ND mode, a negative voltage pulse appears at the bonding pad 1304. Since the ESD voltage is greater than the voltage drop along the circuit path for a portion of the diodes (not shown) in diode series 1308-diode 1316-$N^+/N^-/P^+$ of the SCR 1318, the portion of the diodes (not shown) in the diode series 1308, the diode 1316 and the $N^+/N^-/P^+$ of the SCR 1318 along thecircuit all are turned on. Hence, the triggering terminal of the SCRs 1318 and the SCR 1320 receive a triggering current so that the triggered voltage of the SCRs 1318 and SCR 1320 drop. In addition, because the ESD voltage is greater than all the voltage drops along the circuit path for diode series 1308-SCR 1320-diode 1424-SCR 1318, the diode series 1308, the SCR 1320, the diode 1424 and the SCR 1318 all are turned on. The ESD current flows into two routes. One route goes through some diodes (not shown) in the diode series 1308-diode 1316-$N^+/N^-/P^+$ of SCR 1318. The other route goes through the diode series 1308, the SCR 1320, diode 1424, and the SCR 1318. Thus, damage on the internal circuit 1302 is surely avoided. After dumping the ESD current via the diode series 1308, the SCR 1320, the diode 1424 and the SCR 1318, the SCR 1318 and the SCR 1320 are immediately shut because the holding voltage of the SCR 1318 and the SCR 1320 together with the voltage drop in the diode 1424 is now greater than the operating voltage VDD.

In the voltage source VDD terminal/voltage source VSS terminal mode, a positive voltage pulse appears at the voltage source VDD terminal. Since the ESD voltage is greater than the voltage drop along the circuit path for $P^+/N^-/N^+$ of the SCR 1318-diode 1316-portion of diodes (not shown) in diode series 1308-portion of the diodes (not shown) in diode series 1306-diode 1310-$P^+/P^-/N^+$ of the SCR 1314, the $P^+/N^-/N^+$ of the SCR 1318, the diode 1316, the portion of diodes (not shown) in diode series 1308, the portion of diodes (not shown) in diode series 1306, the diode 1310 and the $P^+/P^-/N^+$ of the SCR 1314 all are turned on. Hence, the triggering terminal of the SCR 1312 and the SCR 1314 receive a triggering current so that the triggered voltage of the SCR 1312 and SCR 1314 drop. In addition, because the ESD voltage is greater than the voltage drop across the SCR 1312, the diode 1422 and the SCR 1314, the SCR 1312, the diode 1422 and the SCR 1314 conduct. Most of the ESD current is released through the SCR 1312, the diode 1422 and the SCR 1314. Thus, damage on the internal circuit 1302 is surely avoided. After dumping the ESD current via the SCR 1312, the diode 1422 and the SCR 1314, the SCRs 1312 and 1314 are immediately shut because the holding voltage of the SCRs 1312 and 1314 together with the voltage drop in the diode 1422 is now greater than the operating voltage VDD.

In conclusion, this invention provides a low capacitance electrostatic discharge protection circuit for a built-in CMOS chip that incorporates a control circuit for substrate triggering so that the triggered voltage of the SCR is reduced and conductive efficiency of the ESD protection circuit is improved. This invention is capable of increasing the holding voltage for SCR during conduction so that large current leak at source terminals due to the latching of conductive SCR is prevented. The protection circuit is capable of protecting the entire chip. Furthermore, the particular circuit design adopted in this invention reduces input capacitance so that the chip circuit can be applied to high frequency and radio frequency circuits.

It will be apparent to those skilled in the art that various modifications and variations can be made to the structure of the present invention without departing from the scope or spirit of the invention. In view of the aforementioned, it is intended that the present invention cover modifications and variations of this invention provided that they fall within the scope of the following claims and their equivalents.

What is claimed is:

1. A low capacitance electrostatic discharge (ESD) circuit for a built-in CMOS chip capable of protecting an internal circuit within the chip, wherein the ESD protection circuit is coupled to a bonding pad and the internal circuit, a first voltage source and a second voltage source are also provided to the ESD protection circuit, the ESD protection circuit comprising:

a first diode series, wherein the negative terminal of the first diode series is coupled to the first voltage source and the positive terminal of the first diode series is coupled to the bonding pad;

a second diode series, wherein the negative terminal of the second diode series is coupled to the positive terminal of the first diode series and the positive terminal of the second diode series is coupled to the second voltage source;

a first control circuit, wherein a first terminal of the first control circuit is coupled to the positive terminal of one of the diodes of the first diode series so that the first control circuit issues a first triggering current when electrostatic discharge occurs;

a third diode series, wherein the positive terminal of the third diode series is coupled to the first voltage source and the negative terminal of the third diode series is coupled to the second voltage source;

a first silicon-controlled rectifier (SCR), wherein the anode node of the first SCR is coupled to the negative terminal of the $(A-1)^{th}$ diode of the third diode series and the cathode node of the first SCR is coupled to the positive terminal of the $A^{th}$ diode of the third diode series, and the triggering terminal of the first SCR is coupled to first control circuit for receiving the first triggering current;

a second control circuit, wherein a first terminal is coupled to the positive terminal of one of the diodes of the second diode series so that the second control circuit issues a second triggering current when electrostatic discharge occurs;

a fourth diode series, wherein the positive terminal of the fourth diode series is coupled to the first voltage source and the negative terminal of the fourth diode series is coupled to the second voltage source; and a second silicon-controlled rectifier (SCR), wherein the anode node of the first SCR is coupled to the positive terminal of the $(B-1)^{th}$ diode of the fourth diode series and the cathode node of the first SCR is coupled to the negative terminal of the $B^{th}$ diode of the fourth diode series, and the triggering terminal of the second SCR is coupled to second control circuit for receiving the second triggering current.

2. The ESD protection circuit of claim 1, wherein the first SCR includes four doped layers $P^+$-$N^-$-$P^-$-$N^+$ from the anode node to the cathode node and an additional $P^+$ layer between the $N^-$-$P^-$ layers, and the $P^+$ layer is the triggering terminal.

3. The ESD protection circuit of claim 1, wherein the second SCR includes four doped layers $P^+$-$N^-$-$P^-$-$N^+$ from the anode node to the cathode node and an additional $N^+$ layer between the $N^-$-$P^-$ layers, and the $N^+$ layer is the triggering terminal.

4. The ESD protection circuit of claim 1, wherein the first diode series comprises of a first diode and a second diode connected serially together and the second diode series comprises of a third diode and a fourth diode connected serially together.

5. The ESD protection circuit of claim 4, wherein the first control circuit includes a fifth diode having a positive terminal coupled to a point between the negative terminal of the first diode and the positive terminal of the second diode and a negative terminal coupled to the triggering terminal of the first SCR, and the second control circuit includes a sixth diode having a negative terminal coupled to a point between the negative terminal of the third diode and the positive terminal of the fourth diode and a positive terminal coupled to the triggering terminal of the second SCR.

6. The ESD protection circuit of claim 5, wherein the third diode series includes a seventh diode having a positive terminal coupled to the cathode node of the first SCR and a negative terminal coupled to the second voltage source such that the anode node of the first SCR is coupled to the first voltage source, the fourth diode series includes an eighth diode having a negative terminal coupled to the anode node of the second SCR and a positive terminal coupled to the first voltage source such that the cathode node of the second SCR is coupled to the second voltage source.

7. The ESD protection circuit of claim 1, wherein the first diode series comprises of a first diode and a second diode connected serially together and the second diode series comprises of a third diode and a fourth diode connected serially together.

8. The ESD protection circuit of claim 7, wherein the first control circuit comprises of a fifth diode and a sixth diode connected serially together, the positive terminal of the fifth diode is coupled to a point between the negative terminal of the first diode and the positive terminal of the second diode, the negative terminal of the sixth diode is coupled to the triggering terminal of the first SCR, and the second control circuit comprises of a seventh diode, the negative terminal of the seventh diode is coupled to the point between the negative terminal of the third diode and the positive terminal of the fourth diode and the positive terminal of the seventh diode is coupled to the triggering terminal of the second SCR.

9. The ESD protection circuit of claim 8, wherein the third diode series comprises of an eight diode, the positive terminal of the eighth diode is coupled to the cathode node of the first SCR and the negative terminal of the eighth diode is coupled to the second voltage source, the anode node of the first SCR is coupled to the first voltage source, the fourth diode series comprises of a ninth diode, the negative terminal of the ninth diode is coupled to the anode node of the second SCR and the positive terminal of the ninth diode is coupled to the first voltage source, and the cathode node of the first SCR is coupled to the second voltage source.

10. The ESD protection circuit of claim 1, wherein the first diode series comprises of a first diode and a second diode series connected serially together, and the second diode series comprises of a third diode and a fourth diode series connected serially together.

11. The ESD protection circuit of claim 10, wherein the first control circuit comprises of a fifth diode, the positive terminal of the fifth diode is coupled to the point between the negative terminal of the first diode and the positive terminal of the second diode, the negative terminal of the fifth diode is coupled to the triggering terminal of the first SCR, and the second control circuit comprises of a sixth diode, the negative terminal of the sixth diode is coupled to a point between the negative terminal of the third diode and the positive terminal of the fourth diode, and the positive terminal of the sixth diode is coupled to the triggering terminal of the second SCR.

12. The ESD protection circuit of claim 11, wherein the third diode series and the fourth diode series comprise of a plurality of serially connected diodes.

13. The ESD protection circuit of claim 1, wherein the first diode series comprises of a first diode and a second diode series connected serially together and the second diode series comprises of a third diode and a fourth diode series connected serially together.

14. The ESD protection circuit of claim 13, wherein the first control circuit comprises of a first Zener diode, the negative terminal of the first Zener diode is coupled to a point between the negative terminal of the first diode and the positive terminal of the second diode, the positive terminal of the first Zener diode is coupled to the triggering terminal of the first SCR, and the second control circuit comprises of a second Zener diode, the positive terminal of the second Zener diode is coupled to a point between the negative terminal of the third diode and the positive terminal of the fourth diode, and the negative terminal of the second Zener diode is coupled to the triggering terminal of the second SCR.

15. The ESD protection circuit of claim 14, wherein the third diode series comprises of a fifth diode, the positive terminal of the fifth diode is coupled to the cathode node of the first SCR, the negative terminal of the fifth diode is coupled to the second voltage source, the anode node of the first SCR is coupled to the first voltage source, and the fourth diode series comprises of a sixth diode, the negative terminal of the sixth diode is coupled to the anode node of the second SCR, and the cathode node of the first SCR is coupled to the second voltage source.

16. The ESD protection circuit of claim 1, wherein the first diode series comprises of a first diode and a second diode series connected serially together and the second diode series comprises of a third diode and a fourth diode series connected serially together.

17. The ESD protection circuit of claim 16, wherein the first control circuit comprises of a first Zener diode, the negative terminal of the first Zener diode is coupled to a point between the negative terminal of the first diode and the positive terminal of the second diode, the positive terminal of the first Zener diode is coupled to the triggering terminal of the first SCR, and the second control circuit comprises of a second Zener diode, the positive terminal of the second Zener diode is coupled to a point between the negative terminal of the third diode and the positive terminal of the fourth diode, and the negative terminal of the second Zener diode is coupled to the triggering terminal of the second SCR.

18. The ESD protection circuit of claim 17, wherein the third diode series and the fourth diode series comprise of a plurality of serially connected diodes.

19. The ESD protection circuit of claim 1, wherein the first diode series and the second diode series comprise of a plurality of serially connected diodes.

20. The ESD protection circuit of claim 19, wherein the first control circuit comprises of a first diode, the positive terminal of the fist diode is coupled to the positive terminal of one of the diodes of the first diode series, the negative terminal of the first diode is coupled to the triggering terminal of the first SCR, and the second control circuit comprises of a second diode, the negative terminal of the second diode is coupled to a positive terminal of one of the diodes in the second diode series and the positive terminal of the second diode is coupled to the triggering terminal of the second SCR.

21. The ESD protection circuit of claim 20, wherein the third diode series comprises of a third diode, the positive terminal of the third diode is coupled to the cathode node of the first SCR, the negative terminal of the third diode is coupled to the second voltage source, the anode node of the first SCR is coupled to the first voltage source, and the fourth diode series comprises of a fourth diode, the negative terminal of the fourth diode is coupled to the anode node of the second SCR, the positive terminal of the fourth diode is coupled to the first voltage source and the cathode node of the first SCR is coupled to the second voltage source.

22. The ESD protection circuit of claim 1, wherein the first diode series and the second diode series comprise of a plurality of serially connected diodes.

23. The ESD protection circuit of claim 22, wherein the first control circuit comprises of a first Zener diode, the negative terminal of the first Zener diode is coupled to the positive terminal of one of the diodes in the first diode series, the positive terminal of the first Zener diode is coupled to the triggering terminal of the first SCR, and the second control circuit comprises of a second Zener diode, the positive terminal of the second diode is coupled to the positive terminal of one of the diodes in the second diode series and the negative terminal of the second Zener diode is coupled to the triggering terminal of the second SCR.

24. The ESD protection circuit of claim 23, wherein the third diode series comprises of a first diode, the positive terminal of the first diode is coupled to the cathode node of the first SCR, the negative terminal of the first diode is coupled to the second voltage source, the anode node of the first SCR is coupled to the first voltage source, and the fourth diode series comprises of a second diode, the negative terminal of the second diode is coupled to the anode node of the second SCR, the positive terminal of the second diode is coupled to the first voltage source, and the cathode node of the first SCR is coupled to the second voltage source.

25. A low capacitance electrostatic protection circuit (ESD) for a built-in CMOS chip capable of protecting an internal circuit within the chip, wherein the ESD protection circuit is coupled to a bonding pad and the internal circuit, a first voltage source and a second voltage source are also provided to the ESD protection circuit, the ESD protection circuit comprising of:

a first diode series having a negative terminal coupled to the first voltage source;

a second diode series having a negative terminal coupled to the positive terminal of the first diode series and a positive terminal coupled to the second voltage source;

a first control circuit having a first terminal coupled to the positive terminal of one of the diodes in the first diode series so that the first control circuit can transmit a first triggering current and a second triggering current when an electrostatic discharge occurs;

a first silicon-controlled rectifier (SCR) having a anode node coupled to the first voltage source and a triggering terminal coupled to the first control circuit for receiving the first triggering current;

a second silicon-controlled rectifier (SCR) having a anode node coupled to the cathode node of the first SCR, a cathode node coupled to the second voltage source and a triggering terminal coupled to the first control circuit for receiving the second triggering current;

a second control circuit having a first terminal coupled to the positive terminal of one of the diodes in the second diode series so that second control circuit can submit a third triggering current and a fourth triggering current when electrostatic discharge occurs;

a third silicon-controlled rectifier (SCR) having a anode node coupled to the first voltage source and a triggering terminal coupled to the second control circuit for receiving the third triggering current; and a fourth silicon-controlled rectifier (SCR) having a anode node coupled to the cathode node of the third SCR, an cathode node coupled to the second voltage source and a triggering terminal coupled to the second control circuit for receiving the fourth triggering current.

26. The ESD protection circuit of claim 25, wherein the first SCR and the second SCR each includes four doped layers $P^+$-$N^-$-$P^-$-$N^+$ from the anode node to the cathode node and an additional $P^+$ layer between the $N^-$-$P^-$ layers, and the $P^+$ layer is the triggering terminal.

27. The ESD protection circuit of claim 25, wherein the third SCR and the fourth SCR each includes four doped layers $P^+$-$N^-$-$P^-$-$N^+$ from the anode node to the cathode node and an additional $N^+$ layer between the $N^-$-$P^-$ layers, and the $N^+$ layer is the triggering terminal.

28. The ESD protection circuit of claim 25, wherein the first diode series and the second diode series comprise of a plurality of serially connected diodes.

29. The ESD protection circuit of claim 25, wherein the first control circuit comprises of a first diode, the positive terminal of the first diode is coupled to a point between the positive terminal of the one of the diodes of the first diode series and the triggering terminal of the first SCR and the negative terminal of the first diode is coupled to the triggering terminal of the second SCR.

30. The ESD protection circuit of claim 25, wherein the second control circuit comprises of a second diode, the negative terminal of the second diode is coupled to a point between the positive terminal of one of the diodes of the second diode series and the triggering terminal of the third SCR and the positive terminal of the second diode is coupled to the triggering terminal of the fourth SCR.

31. A low capacitance electrostatic protection circuit (ESD) for a built-in CMOS chip capable of protecting an internal circuit within the chip, wherein the ESD protection circuit is coupled to a bonding pad and the internal circuit, a first voltage source and a second voltage source are also provided to the ESD protection circuit, the ESD protection circuit comprising of:

a first diode series having a negative terminal coupled to the first voltage source;

a second diode series having a negative terminal coupled to the positive terminal of the first diode series and a positive terminal coupled to the second voltage source;

a first control circuit having a first terminal coupled to the positive terminal of one of the diodes in the first diode series so that the first control circuit can transmit a first triggering current and a second triggering current when an electrostatic discharge occurs;

a first silicon-controlled rectifier (SCR) having a anode node coupled to the first voltage source and a triggering terminal coupled to the first control circuit for receiving the first triggering current;

a first diode having a positive terminal coupled to the cathode node of the first SCR;

a second silicon-controlled rectifier (SCR) having a anode node coupled to negative terminal of the first diode, an cathode node coupled to the second voltage source and a triggering terminal coupled to the first control circuit for receiving the second triggering current;

a second control circuit having a first terminal coupled to the positive terminal of one of the diodes in the second diode series so that second control circuit can submit a third triggering current and a fourth triggering current when electrostatic discharge occurs;

a third silicon-controlled rectifier (SCR) having a anode node coupled to the first voltage source and a triggering terminal coupled to the second control circuit for receiving the third triggering current;

a second diode having a positive terminal coupled to the cathode node of the third SCR; and a fourth silicon-controlled rectifier (SCR) having a anode node coupled to the negative terminal of the second diode, an cathode node coupled to the second voltage source and a triggering terminal coupled to the second control circuit for receiving the fourth triggering current.

32. The ESD protection circuit of claim 31, wherein the first SCR and the second SCR each includes four doped layers $P^+$-$N^-$-$P^-$-$N^+$ from the anode node to the cathode node and an additional $P^+$ layer between the layers, $N^-$-$P^-$ and the $P^+$ layer is the triggering terminal.

33. The ESD protection circuit of claim 31, wherein the third SCR and the fourth SCR each includes four doped layers $P^+$-$N^-$-$P^-$-$N^+$ from the anode node to the cathode node and an additional $N^+$ layer between the $N^-$-$P^-$ layers, and the $N^+$ layer is the triggering terminal.

34. The ESD protection circuit of claim 31, wherein the first diode series and the second diode series comprise of a plurality of serially connected diodes.

35. The ESD protection circuit of claim 31, wherein the first control circuit comprises of a third diode, the positive terminal of the third diode is coupled to a point between the positive terminal of one of the diodes in the first diode series and the triggering terminal of the first SCR and the negative terminal of the third diode is coupled to the triggering terminal of the second SCR.

36. The ESD protection circuit of claim 31, wherein the second control circuit comprises of a fourth diode, the negative terminal of the fourth diode is coupled to a point between the positive terminal of one of the diodes in the second diode series and the triggering terminal of the fourth SCR and the positive terminal of the second diode is coupled to the triggering terminal of the third SCR.

* * * * *